United States Patent
Ueki

(10) Patent No.: US 10,886,730 B2
(45) Date of Patent: Jan. 5, 2021

(54) FILTER HAVING AN ESD PROTECTION DEVICE

(71) Applicant: Murata Manufacturing Co., Ltd., Nagaokakyo (JP)

(72) Inventor: Noriyuki Ueki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 253 days.

(21) Appl. No.: 16/227,123

(22) Filed: Dec. 20, 2018

(65) Prior Publication Data

US 2019/0123553 A1 Apr. 25, 2019

Related U.S. Application Data

(63) Continuation of application No. PCT/JP2017/036052, filed on Oct. 4, 2017.

(30) Foreign Application Priority Data

Oct. 7, 2016 (JP) .................... 2016-199550

(51) Int. Cl.
*H02H 9/04* (2006.01)
*H01L 29/866* (2006.01)
(Continued)

(52) U.S. Cl.
CPC ......... *H02H 9/045* (2013.01); *H01L 23/4951* (2013.01); *H01L 27/0248* (2013.01);
(Continued)

(58) Field of Classification Search
CPC ........ H03H 7/0107; H03H 7/427; H03H 7/38; H03H 7/09; H01L 23/4951;
(Continued)

(56) References Cited

U.S. PATENT DOCUMENTS

| 8,400,249 B2 | 3/2013 | Kato |
| 9,755,606 B2 | 9/2017 | Ueki et al. |

(Continued)

FOREIGN PATENT DOCUMENTS

| JP | 201312702 A | 1/2013 |
| WO | 2015087794 A1 | 6/2015 |

(Continued)

OTHER PUBLICATIONS

International Search Report issued in PCT/JP2017/036052, dated Dec. 26, 2017.

(Continued)

*Primary Examiner* — Kevin J Comber
(74) *Attorney, Agent, or Firm* — Arent Fox LLP

(57) ABSTRACT

A filter that includes a series circuit of a first Zener diode and a second Zener diode, a third Zener diode connected between a node and ground, and a third inductor. A first series resonant circuit is formed by a parasitic capacitance of the first Zener diode, a parasitic capacitance of the third Zener diode, and the third inductor, and a second series resonant circuit is formed by a parasitic capacitance of the second Zener diode, the parasitic capacitance of the third Zener diode, and the third inductor. Moreover, the parasitic capacitances of the first Zener diode and the second Zener diode are substantially equal, and the parasitic capacitance of the third Zener diode is larger than the parasitic capacitance of each of the first Zener diode and the second Zener diode.

17 Claims, 29 Drawing Sheets

(51) Int. Cl.
*H03H 7/38* (2006.01)
*H01L 27/02* (2006.01)
*H01L 23/495* (2006.01)
*H03H 7/42* (2006.01)
*H03H 7/01* (2006.01)
*H03H 7/09* (2006.01)

(52) U.S. Cl.
CPC .............. *H01L 29/866* (2013.01); *H02H 9/04* (2013.01); *H03H 7/0107* (2013.01); *H03H 7/38* (2013.01); *H03H 7/427* (2013.01); *H01L 23/49562* (2013.01); *H01L 27/0255* (2013.01); *H01L 2224/32245* (2013.01); *H01L 2224/48247* (2013.01); *H01L 2224/73265* (2013.01); *H03H 7/09* (2013.01)

(58) Field of Classification Search
CPC ........... H01L 23/49562; H01L 27/0248; H01L 27/0255; H01L 29/866; H01L 2224/48247; H01L 2224/32245; H01L 2224/73265; H01L 2924/00; H02H 9/04; H02H 9/041; H02H 9/045
USPC .......................................................... 361/56
See application file for complete search history.

(56) References Cited

U.S. PATENT DOCUMENTS

| | | |
|---|---|---|
| 10,062,501 B2 | 8/2018 | Shigematsu |
| 10,193,336 B2 | 1/2019 | Ueki |
| 2010/0277254 A1 | 11/2010 | Guitton et al. |
| 2010/0277256 A1 | 11/2010 | Concord |
| 2011/0163352 A1 | 7/2011 | Gee et al. |
| 2012/0306609 A1 | 12/2012 | Kato |
| 2014/0160607 A1 | 6/2014 | Reimann et al. |
| 2016/0142031 A1 | 5/2016 | Ueki et al. |
| 2016/0351327 A1 | 12/2016 | Shigematsu |
| 2017/0373492 A1 | 12/2017 | Ueki |

FOREIGN PATENT DOCUMENTS

| | | |
|---|---|---|
| WO | 2016080108 A1 | 5/2016 |
| WO | 2017159282 A1 | 9/2017 |

OTHER PUBLICATIONS

Written Opinion of the International Searching Authority issued in PCT/JP2017/036052, dated Dec. 26, 2017.

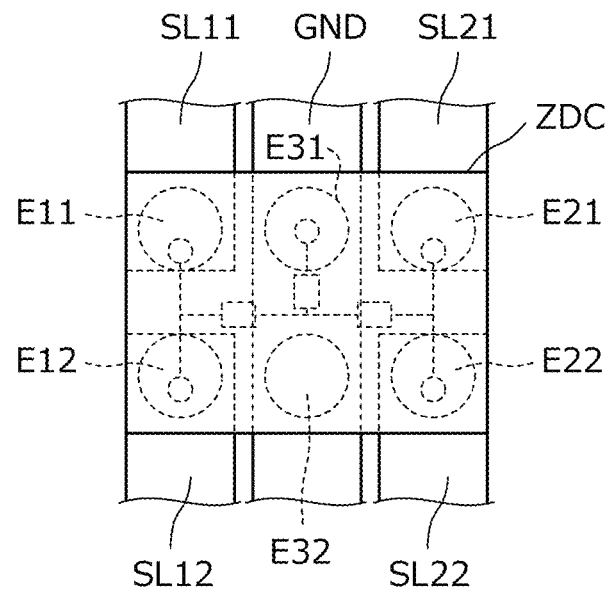
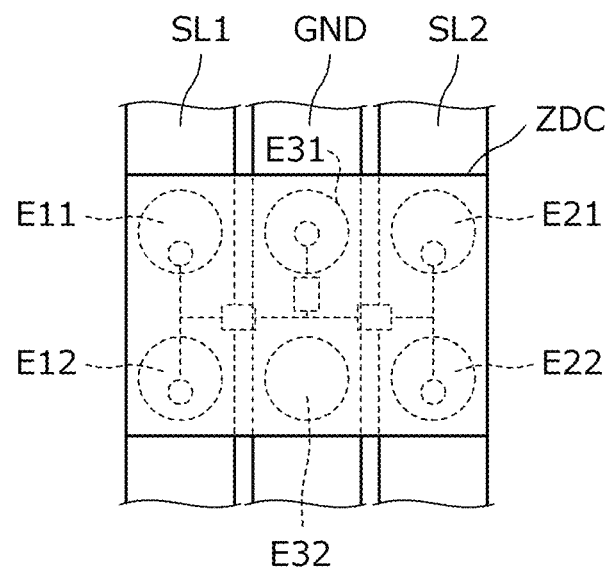

FILTER HAVING AN ESD PROTECTION DEVICE

CROSS-REFERENCE TO RELATED APPLICATIONS

The present application is a continuation of PCT/JP2017/036052 filed Oct. 4, 2017, which claims priority to Japanese Patent Application No. 2016-199550, filed Oct. 7, 2016, the entire contents of each of which are incorporated herein by reference.

TECHNICAL FIELD

The present disclosure relates to a filter including an ESD protection device and a common mode choke coil.

BACKGROUND

In general, in a high-speed serial interface, a differential transmission system can be used by which signals having a phase difference of 180° are transmitted via a balanced line. Radiation noise and exogenous noise are compensated along a balanced line in the differential transmission system, which is unlikely to be affected by these types of noise. However, common mode noise current occurs due to asymmetry of signal lines depending on a usage environment. In order to suppress such common mode noise, a common mode filter is used.

Furthermore, in a high-speed serial interface, an ESD protection device is used to protect electronic circuits against external electro-static discharge (ESD).

For instance, Patent Document 1 (identified below) describes a common mode filter equipped with an ESD protection circuit, the common mode filter including an ESD protection device and a common mode choke coil.

Patent Document 1: International Publication No. 2016/080108.

The common mode filter equipped with an ESD protection circuit is a circuit in which a common mode filter and an ESD protection device are connected by some wiring, and thus includes an inductive component (parasitic inductance) that occurs in the wiring section. Also, in a normal state where an operating voltage is not reached, the ESD protection device includes a capacitive component (parasitic capacitance) due to its structure. Therefore, the common mode filter equipped with an ESD protection circuit also includes the capacitive component of the ESD protection device.

The above-mentioned inductive component and capacitive component affect the original characteristics of a common mode filter, and thus the filter characteristic in an actual usage state is different from the characteristic of a common mode filter alone. In addition, when the size of the ESD protection device is reduced in order to reduce the parasitic capacitance of the ESD protection device in consideration of the filter characteristic of the common mode filter, ESD protection characteristic deteriorates.

SUMMARY OF THE INVENTION

Accordingly, it is an object of the present disclosure is to provide a filter that ensures predetermined filter characteristic of the common mode filter without deteriorating the ESD protection characteristic of the ESD protection device. Another object of the present disclosure is to provide a filter in which filter characteristic of the common mode filter is improved by utilizing the ESD protection device.

Thus, in an exemplary aspect, a filter is disclosed that includes a differential transmission line that includes a first signal line and a second signal line and transmits a high frequency signal; a common mode choke coil including a first inductor inserted in the first signal line, and a second inductor inserted in the second signal line and magnetically coupled to the first inductor; and an ESD protection circuit. Moreover, the exemplary ESD protection circuit includes a series circuit of a first ESD protection device and a second ESD protection device that are connected between the first signal line and the second signal line, a third ESD protection device connected between a ground and a node between the first ESD protection device and the second ESD protection device, and a third inductor connected in series to the third ESD protection device and implemented by an inductor device or a parasitic inductance component. In addition, a first series resonant circuit is formed by a parasitic capacitance of the first ESD protection device, a parasitic capacitance of the third ESD protection device, and the third inductor, and a second series resonant circuit is formed by a parasitic capacitance of the second ESD protection device, the parasitic capacitance of the third ESD protection device, and the third inductor. In the exemplary embodiment, the parasitic capacitances of the first ESD protection device and the second ESD protection device are substantially equal, and the parasitic capacitance of the third ESD protection device is larger than the parasitic capacitance of the first ESD protection device and the parasitic capacitance of the second ESD protection device.

With the above-described configuration, the size of the third ESD protection device is increased and therefore the resistance value of the ESD protection device is decreased, and ESD protection performance is improved. Since the first ESD protection device and the third inductor which are connected to the first inductor included in the common mode choke coil form a series resonant circuit, and the second ESD protection device and the third inductor which are connected to the second inductor included in the common mode choke coil form a series resonant circuit, these series resonant circuits act as trap filters for common mode noise. Therefore, the elimination band for common mode noise can be made wider.

According to an exemplary aspect, the third inductor is formed, for instance, by a coil-shaped or line-shaped conductive pattern with less than one turn. Consequently, the inductance of the third inductor is not excessively increased, and the resistance component of the third inductor is reduced. Thus, decrease in the ESD protection performance is reduced.

According to another exemplary aspect, the differential transmission line, the common mode choke coil, and the ESD protection circuit are preferably formed in or on a single substrate. Consequently, a the size of the filter can be reduced. In addition, a wire of each portion is shortened, and the parasitic component is reduced. Thus, the filter characteristic of the common mode filter and the ESD protection performance of the EDS protection device are improved.

According to another exemplary aspect, the exemplary filter of preferably includes an input/output terminal formed in or on the substrate and connected to the differential transmission line, and the ESD protection circuit and the common mode choke coil overlap in plan view of the substrate, and the ESD protection circuit be disposed at a position closer to the input/output terminal of the substrate than the common mode choke coil is. Due to this structure, when the filter is mounted to a circuit board or the like, the area occupied by the filter is reduced. In addition, the path from the EDS protection device to a ground conductor formed in a circuit board or the like is shortened, and thus the parasitic component on the path is reduced, and the ESD protection performance is improved.

According to another exemplary aspect, the third inductor preferably does not overlap with the first inductor and the second inductor in plan view of the substrate. Due to this structure, unnecessary coupling between the first inductor and the second inductor via the third inductor does not occur, and also, when an ESD current flows into the third inductor, unnecessary induction to the first inductor and the second inductor does not occur.

According to another exemplary aspect, the first ESD protection device includes a first Zener diode, a first diode connected in series to the first Zener diode in a direction in which a forward bias current of the first Zener diode is blocked, and a second diode connected in parallel with a series circuit of the first Zener diode and the first diode with reverse polarity to the first diode, and the second ESD protection device includes a second Zener diode, a third diode connected in series to the second Zener diode in a direction in which a forward bias current of the second Zener diode is blocked, and a fourth diode connected in parallel with a series circuit of the second Zener diode and the third diode with reverse polarity to the third diode.

With the above-described configuration, the combined parasitic capacitance of the first ESD protection device and the combined parasitic capacitance of the second ESD protection device for a differential signal are reduced. Therefore, the effect of the first ESD protection device and the second ESD protection device on the differential signal is reduced, and deterioration of the bandpass characteristics of the differential signal is suppressed. Since the combined parasitic capacitance of the first ESD protection device and the combined parasitic capacitance of the second ESD protection device can be increased relative to the common mode noise, the ESD protection performance can be improved.

According to another exemplary aspect, the third ESD protection device includes a third Zener diode, a fifth diode connected in series to the third Zener diode in a direction in which a forward bias current of the third Zener diode is blocked, and a sixth diode connected in parallel with a series circuit of the third Zener diode and the fifth diode with reverse polarity to the fifth diode. With this configuration, the combined parasitic capacitance of the third ESD protection device can be increased relative to the common mode noise, thus the ESD protection performance can be improved.

According to another exemplary aspect, the exemplary filter preferably further includes a matching inductor that is inserted in the differential transmission line in a preceding stage, a following stage, or both the preceding and following stages of the ESD protection circuit. Consequently, impedance matching of the ESD protection circuit for the differential transmission line is achieved.

For exemplary purposes, the ESD protection circuit is configured as follows.

Specifically, the ESD protection circuit can include a semiconductor substrate which includes a substrate layer and an epitaxial layer formed on the substrate layer and on which a first terminal, a second terminal, and a third terminal are formed.

According to an exemplary aspect, the node is the substrate layer, the first ESD protection device has a first parallel circuit that is formed in the epitaxial layer between the substrate layer and the first terminal, and includes a first high current diode and a first low current diode, the second ESD protection device has a second parallel circuit that is formed in the epitaxial layer between the substrate layer and the second terminal, and includes a second high current diode and a second low current diode, the third ESD protection device has a third parallel circuit that is formed in the epitaxial layer between the substrate layer and the third terminal, and includes a third high current diode and a third low current diode, and the third ESD protection device is formed in an area in the epitaxial layer and between the first ESD protection device and the second ESD protection device.

Moreover, each of an arrangement (i.e., an orientation) direction of the first high current diode and the first low current diode, an arrangement direction of the second high current diode and the second low current diode, and an arrangement direction of the third high current diode and the third low current diode is orthogonal to an arrangement direction of the first ESD protection device, the second ESD protection device, and the third ESD protection device.

In plan view of the semiconductor substrate, the third low current diode is formed in an area between the first high current diode and the second high current diode, and the third high current diode is formed in an area between the first low current diode and the second low current diode.

According to another exemplary aspect, a formation area of the third high current diode is preferably larger than a formation area of the first high current diode and a formation area of the second high current diode, and a formation area of the third low current diode is preferably larger than a formation area of the first low current diode and a formation area of the second low current diode.

For exemplary purposes, the ESD protection circuit is configured as follows.

The ESD protection circuit can include a semiconductor substrate which includes a substrate layer and an epitaxial layer formed on the substrate layer and in which a first terminal, a second terminal, and a third terminal are formed.

The node is the substrate layer, the first ESD protection device has a first parallel circuit that is formed in the epitaxial layer between the substrate layer and the first terminal, and includes a first high current diode and a first low current diode, the second ESD protection device has a second parallel circuit that is formed in the epitaxial layer between the substrate layer and the second terminal, and includes a second high current diode and a second low current diode, the third ESD protection device has a Zener diode formed in the epitaxial layer between the substrate layer and the third terminal, and the third ESD protection device is formed in an area in the epitaxial layer and between the first ESD protection device and the second ESD protection device.

Each of an arrangement direction of the first high current diode and the first low current diode and an arrangement direction of the second high current diode and the second low current diode is orthogonal to an arrangement direction of the first ESD protection device, the second ESD protection device, and the third ESD protection device.

In plan view of the semiconductor substrate, the Zener diode is formed in an area between the first high current diode and the second high current diode, and in an area between the first low current diode and the second low current diode.

Advantageous Effects of Invention

According to the exemplary embodiments and aspects of the present disclosure, a filter is provided that exhibits a predetermined filter characteristic of the common mode filter without causing deterioration of the ESD protection characteristic of the ESD protection device. Also, a filter is provided, in which a filter characteristic of the common mode filter is improved by utilizing the ESD protection device.

BRIEF DESCRIPTION OF DRAWINGS

FIGS. 32(A) and 32(B) are plan views illustrating the structure of coupling of the diode chip ZDC according to the ninth embodiment to signal lines or the like on the circuit board.

DETAILED DESCRIPTION OF EMBODIMENTS

Figure 1:
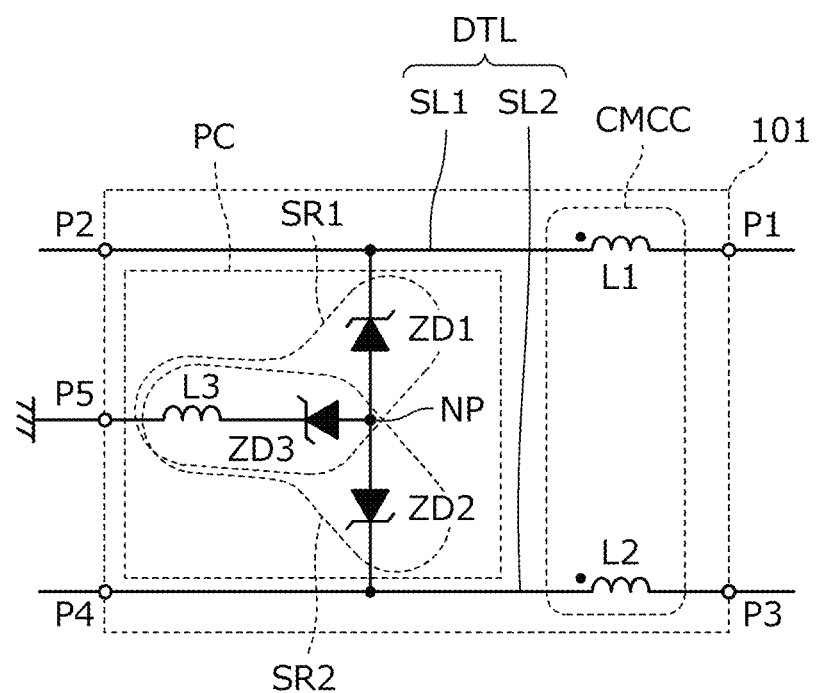
FIG. 1 is a circuit diagram of a filter according to a first embodiment.

Hereinafter multiple exemplary embodiments for carrying out the present invention will be described by giving some specific examples with reference to the drawings. It is noted that the same components are labeled with the same symbol in the drawings. Although embodiments are separately described for the sake of convenience in consideration of description of the main point or simplicity of understanding, partial replacement and combination of components described in different embodiments are possible. In the second and subsequent embodiments, a description of common features with the first embodiment is omitted, and only different points will be described. In particular, the same operational effect due to the same configuration will not be mentioned point by point for each embodiment.

First Embodiment

FIG. 1 is a circuit diagram of a filter according to a first embodiment.

A filter 101 includes a differential transmission line DTL, a common mode choke coil CMCC, and an ESD protection circuit PC. It is noted that the disclosed "filter" in the present disclosure can be a filter configured to reduce common mode noise and transmits differential signals.

The differential transmission line DTL includes a first signal line SL1 connected between terminals P1 and P2, and a second signal line SL2 connected between terminals P3 and P4, and transmits high frequency signals, for instance, in the UHF band and the SHF band.

The common mode choke coil CMCC includes a first inductor L1 inserted in the first signal line SL1, and a second inductor L2 that is inserted in the second signal line SL2 and magnetically coupled to the first inductor L1.

Moreover, the ESD protection circuit PC includes a series circuit of a first Zener diode ZD1 and a second Zener diode ZD2 that are connected between the first signal line SL1 and the second signal-line SL2, a third Zener diode ZD3 connected between a ground terminal P5 and a node NP between the first Zener diode ZD1 and the second Zener diode ZD2, and a third inductor L3. The third inductor L3 is inserted between the third Zener diode ZD3 and the ground.

A first series resonant circuit SR1 is formed by the parasitic capacitance of the first Zener diode ZD1, the parasitic capacitance of the third Zener diode ZD3, and the third inductor L3. A second series resonant circuit SR2 is formed by the parasitic capacitance of the second Zener diode ZD2, the parasitic capacitance of the third Zener diode ZD3, and the third inductor L3.

The first Zener diode ZD1 is an example of the "first ESD protection device" in the present disclosure, the second Zener diode ZD2 is an example of the "second ESD protection device" in the present disclosure, and the third Zener diode ZD3 is an example of the "third ESD protection device" in the present disclosure.

Preferably, the parasitic capacitances of the first Zener diode ZD1 and the second Zener diode ZD2 is substantially equal, and the parasitic capacitance of the third Zener diode ZD3 is larger than the parasitic capacitance of the first Zener diode ZD1 and the parasitic capacitance of the second Zener diode ZD2. Let $Czd1$ be the parasitic capacitance of the first Zener diode ZD1, $Czd2$ be the parasitic capacitance of second Zener diode ZD2, and $Czd3$ be the parasitic capacitance of third Zener diode ZD3, then the following relationship is held: $Czd1 \approx Czd2$, $Czd3 > Czd1$, and $Czd3 > Czd2$.

The parasitic capacitance of each of the first Zener diode ZD1, the second Zener diode ZD2, the third Zener diode ZD3 is mainly the capacitance of a depletion layer which occurs when the reverse bias voltage of the Zener diode is applied.

In general, the parasitic capacitance of each Zener diode is determined by the size of the Zener diode. With the above-mentioned configuration, the third Zener diode ZD3 is relatively larger in size than the first Zener diode ZD1, and the second Zener diode ZD2, and thus the resistance value of the ESD protection circuit PC is reduced, and the ESD protection performance is increased.

Figure 2A:
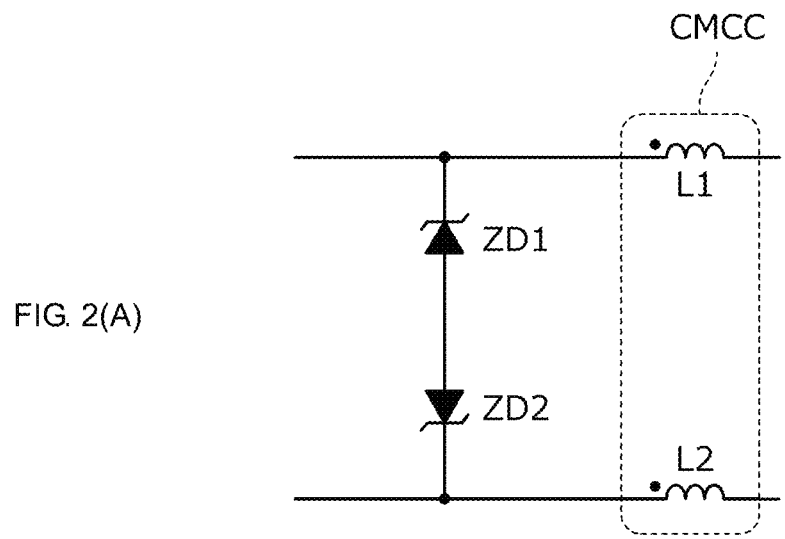
FIG. 2(A) is an equivalent circuit diagram for a differential signal of the filter according to the first embodiment.
Figure 2B:
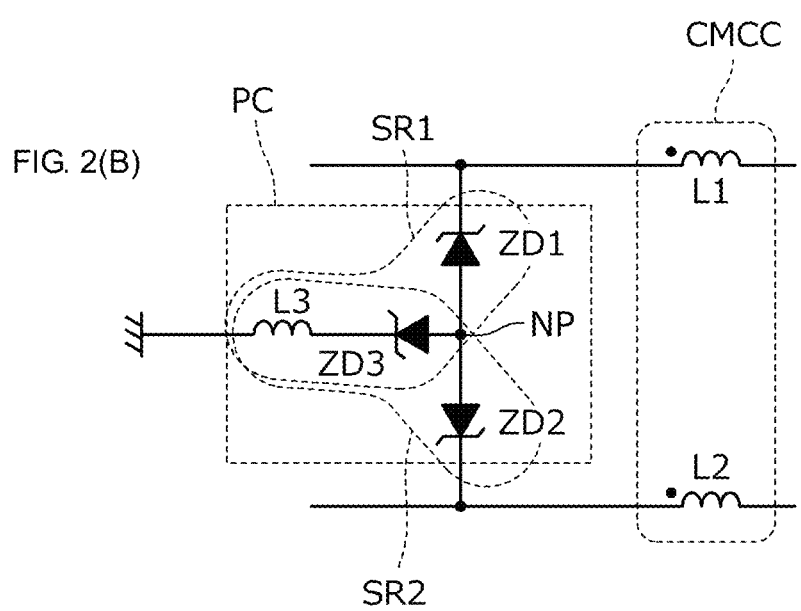
FIG. 2(B) is an equivalent circuit diagram for common mode noise of the filter.

FIG. 2(A) is an equivalent circuit diagram for a differential signal of the filter, and FIG. 2(B) is an equivalent circuit diagram for common mode noise of the filter.

In the filter 101 illustrated in FIG. 1, the parasitic capacitance of the first Zener diode ZD1 and the parasitic capacitance of the second Zener diode ZD2 of the ESD protection circuit PC are substantially equal, thus the node NP between the first Zener diode ZD1 and the second Zener diode ZD2 is a neutral potential, that is, the ground potential. Thus, for a differential signal, the circuit (the third Zener diode ZD3 and the third inductor L3) from the node NP to the ground terminal P5 is not equivalently present.

Therefore, the differential signal is not affected by the presence of the third Zener diode ZD3 having a relatively high parasitic capacitance and the third inductor L3.

On the other hand, as illustrated in FIG. 2(B), for common mode noise, the first series resonant circuit SR1 and the second series resonant circuit SR2 act as trap filters. Specifically, the elimination band for common mode noise is made wider by adjusting the resonance frequencies of the first series resonant circuit SR1 and the second series resonant circuit SR2 to the frequency of common mode noise to be attenuated.

Figure 3:
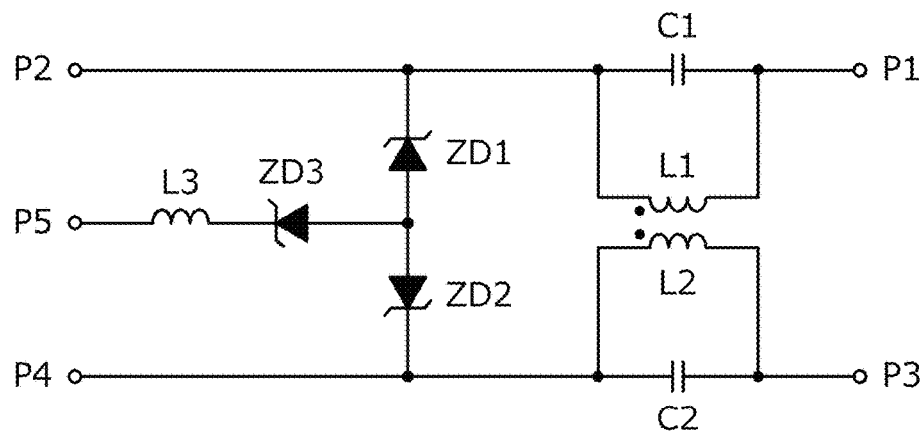
FIG. 3 is a circuit diagram, which includes a parasitic component, of a filter 101 of this embodiment.

FIG. 3 is a circuit diagram, which includes a parasitic component, of the filter 101 of this embodiment. A parasitic capacitance C1 is present in the first inductor L1, and a parasitic capacitance C2 is present in the second inductor L2. The first inductor L1 and the parasitic capacitance C1 form an LC parallel resonant circuit, and the second inductor L2 and the parasitic capacitance C2 form an LC parallel resonant circuit. These two LC parallel resonant circuits acts as a band elimination filter for the common mode noise.

Figure 4:
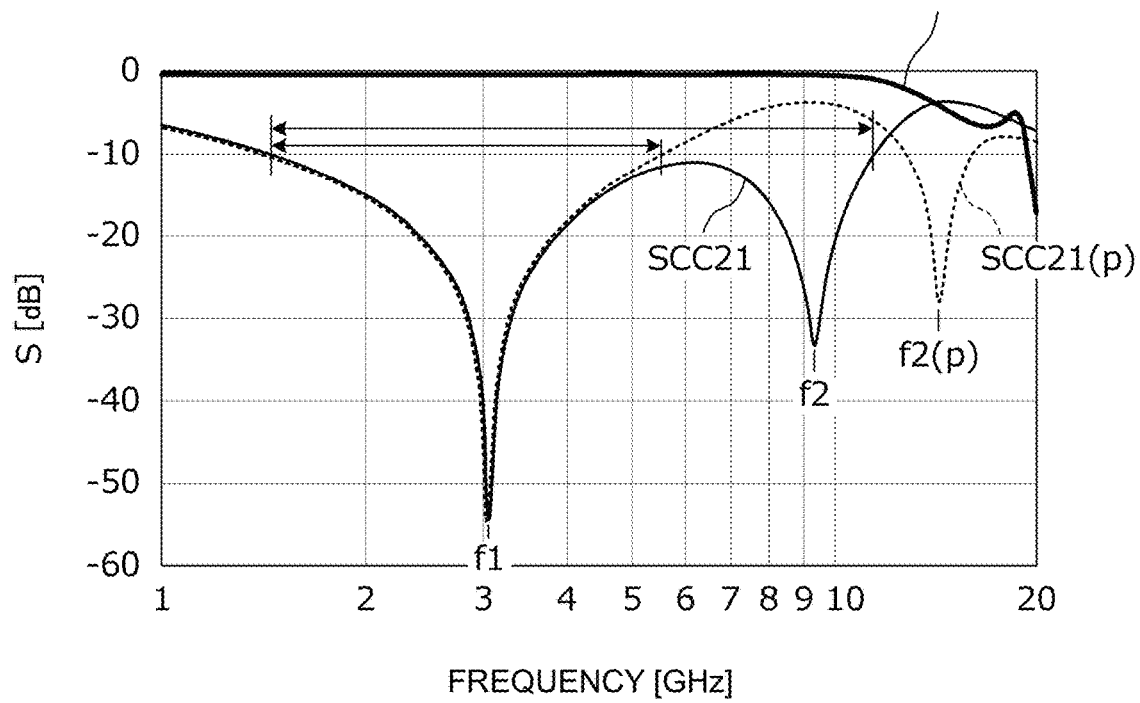
FIG. 4 is a graph illustrating the frequency characteristics of the filter 101 of the first embodiment.

FIG. 4 is a graph illustrating the frequency characteristics of the filter 101 of this embodiment. In FIG. 4, a curve SCC21 indicates insertion loss of common mode noise, and a curve SDD21 indicates insertion loss of the differential signal. Also, a curve SCC21($p$) indicates insertion loss of common mode noise of a filter in a comparative example, and a curve SDD21($p$) indicates insertion loss of a differential signal of a filter in a comparative example.

According to the exemplary aspect:

$Czd1 = Czd2 = 0.4$ pF $Czd3 = 3$ pF

In the filter in the comparative example, the parasitic capacitance of the third Zener diode ZD3 is low and equal to the parasitic capacitance of the first Zener diode ZD1 and the parasitic capacitance of the second Zener diode ZD2. That is, $Czd1 = Czd2 = Czd3 = 0.4$ pF.

As shown in FIG. 4, in the insertion loss SCC21 of the common mode noise, an attenuation pole occurs at each of a frequency f1 (near 3 GHz) and a frequency f2 (near 9.4 GHz). The attenuation pole of the frequency f1 occurs due to the two LC parallel resonant circuits formed by L1, L2, C1, and C2 illustrated in FIG. 3. The first inductor L1 and the second inductor L2 of the common mode choke coil CMCC are additively coupled to a differential signal, thus a mutual inductance is added. The resonant frequency of the two LC parallel resonant circuits for a differential signal is out of the frequency band used.

The attenuation pole at the frequency f2 shown in FIG. 4 is due to the first series resonance circuit SR1 and the second series resonance circuit SR2 (that is, due to the ESD protection circuit PC) illustrated in FIGS. 1 and 2(B). The resonant frequency of the first series resonance circuit SR1 is determined by a combined capacitance of the parasitic capacitance Czd1 of the first Zener diode ZD1 and the parasitic capacitance Czd3 of the third Zener diode ZD3, and the inductance of the third inductor L3. Similarly, the resonant frequency of the second series resonance circuit SR2 is determined by a combined capacitance of the parasitic capacitance Czd2 of the second Zener diode ZD2 and the parasitic capacitance Czd3 of the third Zener diode ZD3, and the inductance of the third inductor L3. Therefore, the frequency f2 at the attenuation pole by the ESD protection circuit PC of the filter 101 of this embodiment is lower than the frequency f2($p$) at the attenuation pole by the ESD protection circuit of the filter in the comparative example.

When the elimination band for common mode noise is set to a frequency band such that the insertion loss is −10 dB or less, as shown in FIG. 4, the elimination band for common mode noise of the filter in the comparative example 1.5 GHz or higher and 5.5 GHz or lower, whereas the elimination band for common mode noise of the filter 101 in this embodiment is 1.5 GHz or higher and 12 GHz or lower which is extremely wide.

Second Embodiment

In a second embodiment, an example of a filter including a matching circuit is presented.

Figure 5:
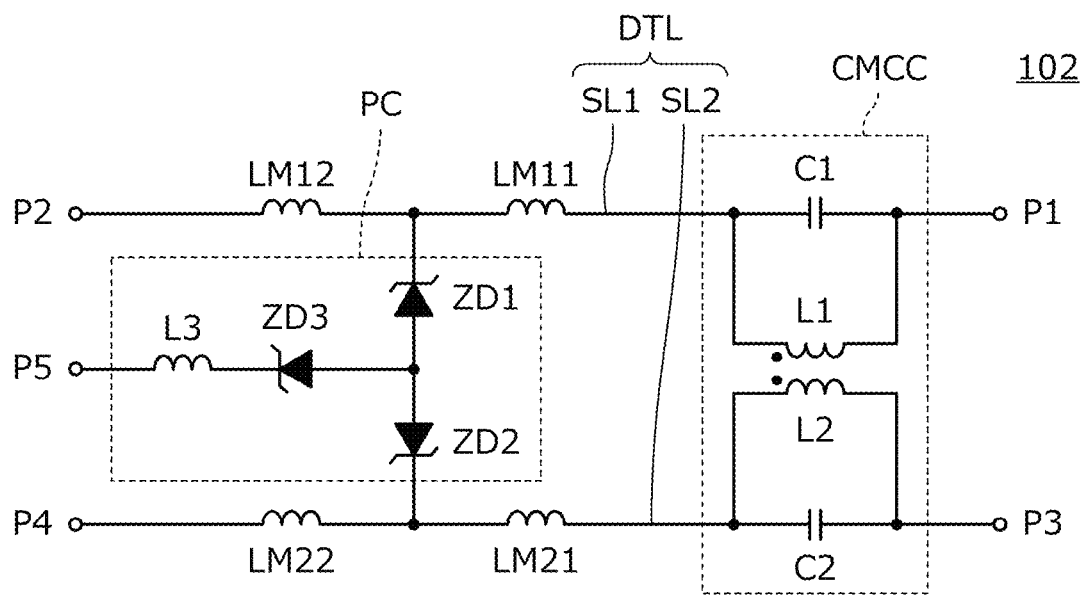
FIG. 5 is a circuit diagram of a filter 102 of a second embodiment.

FIG. 5 is a circuit diagram of a filter 102 of the second embodiment. In this example, a matching inductor LM11 and a matching inductor LM12 are provided between the first inductor L1 and the first Zener diode ZD1 and between the terminal P2 and the first Zener diode ZD1, respectively. Similarly, a matching inductor LM21 and a matching inductor LM22 are provided between the second inductor L2 and the second Zener diode ZD2 and between a terminal P4 and the second Zener diode ZD2, respectively.

Figure 6A:
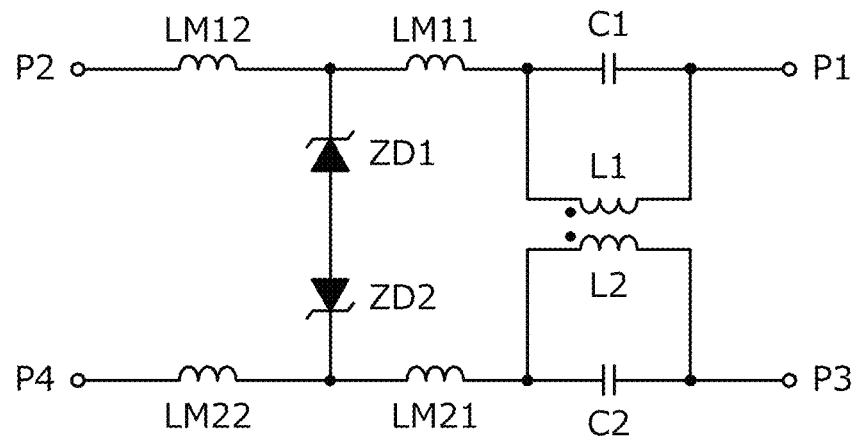
FIG. 6(A) is an equivalent circuit diagram for a differential signal of the filter 102.
Figure 6B:
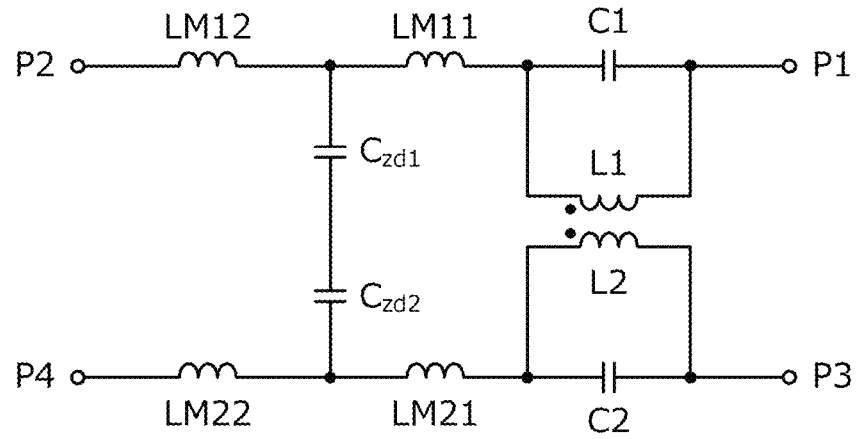
FIG. 6(B) is an equivalent circuit diagram in which a first Zener diode ZD1 and a second Zener diode ZD2 are further represented by capacitors.

FIG. 6(A) is an equivalent circuit diagram for a differential signal of the filter 102. FIG. 6(B) is an equivalent circuit diagram in which the first Zener diode ZD1 and the second Zener diode ZD2 are further represented by capacitors.

In this manner, the matching inductors LM11, LM12, LM21, and LM22 inserted in the differential transmission line DTL are provided in the preceding stage and the following stage of the ESD protection circuit, and thus impedance matching of the ESD protection circuit PC for the differential transmission line DTL is achieved.

It is noted that in the example illustrated in FIG. 5, matching inductors are inserted in both the preceding stage and the following stage of the ESD protection circuit PC. However, matching inductors may be inserted in the preceding stage or the following stage of the ESD protection circuit.

Third Embodiment

Figure 7A:
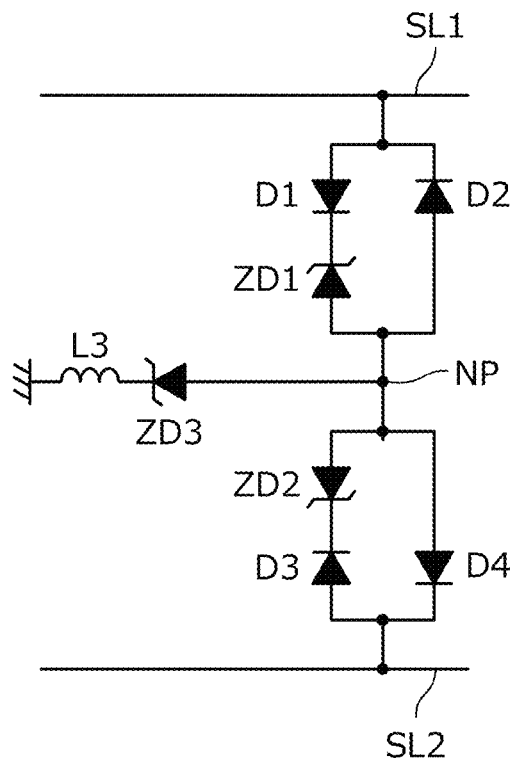
FIGS. 7(A) and 7(B) are circuit diagrams of an ESD protection circuit according to a third embodiment.
Figure 7B:
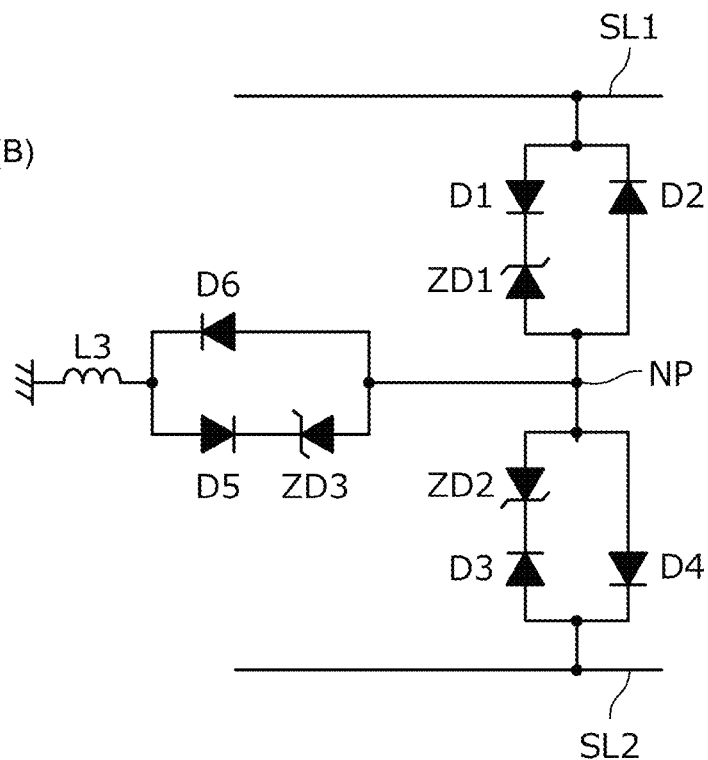

In a third embodiment, some examples of the ESD protection circuit are presented. FIGS. 7(A) and 7(B) are each a circuit diagram of the ESD protection circuit.

In the ESD protection circuit illustrated in FIG. 7(A), a first ESD protection device connected between the first signal line SL1 and the node NP includes the first Zener diode ZD1, a first diode D1 connected in series to the first Zener diode ZD1 in a direction in which a forward bias current of the first Zener diode ZD1 is blocked, and a second diode D2 connected in parallel with a series circuit of the first Zener diode ZD1 and the first diode D1 with reverse polarity to the first diode D1. In addition, a second ESD protection device connected between the second signal line SL2 and the node NP includes the second Zener diode ZD2, a third diode D3 connected in series to the second Zener diode ZD2 in a direction in which a forward bias current of the second Zener diode ZD2 is blocked, and a fourth diode D4 connected in parallel with a series circuit of the second Zener diode ZD2 and the third diode D3 with reverse polarity to the third diode D3.

In the ESD protection circuit illustrated in FIG. 7(B), a third ESD protection device connected between the node NP and the ground includes the third Zener diode ZD3, a fifth diode D5 connected in series to the third Zener diode ZD3 in a direction in which a forward bias current of the third Zener diode ZD3 is blocked, and a sixth diode D6 connected in parallel with a series circuit of the third Zener diode ZD3 and the fifth diode D5 with reverse polarity to the fifth diode D5.

With the configuration illustrated in FIGS. 7(A) and 7(B), the diode D1 is connected in series to the first Zener diode ZD1 and the diode D3 is connected in series to the second Zener diode ZD2, thus the combined capacitance of the first ESD protection device and the second ESD protection device is small. Therefore, the effect of the first ESD protection device and the second ESD protection device on the differential signal is reduced, and deterioration of the bandpass characteristics of the differential signal is suppressed. In addition, since the combined capacitance is reduced, the size of the Zener diodes ZD1, ZD2 is increased accordingly, and thus the ESD protection performance can be improved.

In addition, with the configuration illustrated in FIG. 7(B), the combined capacitance of the third ESD protection device can be reduced, thus even when the third Zener diode ZD3 having a large size is used, the size of the third Zener diode ZD3 can be increased while setting the resonant frequency of each of the first series resonance circuit SR1 and the second series resonance circuit SR2 illustrated in FIGS. 1 and 2(B) to a predetermined value. Consequently, the ESD protection performance can be further improved.

Figure 8A:
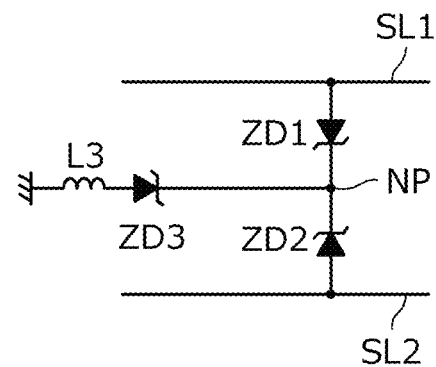
FIGS. 8(A), 8(B), and 8(C) are circuit diagrams of another ESD protection circuit according to the third embodiment.
Figure 8B:
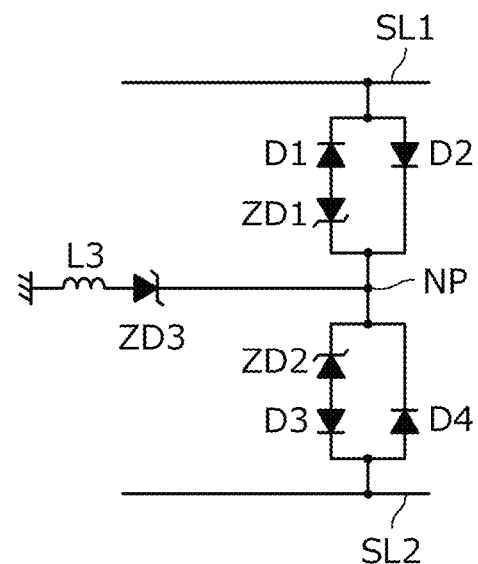
Figure 8C:
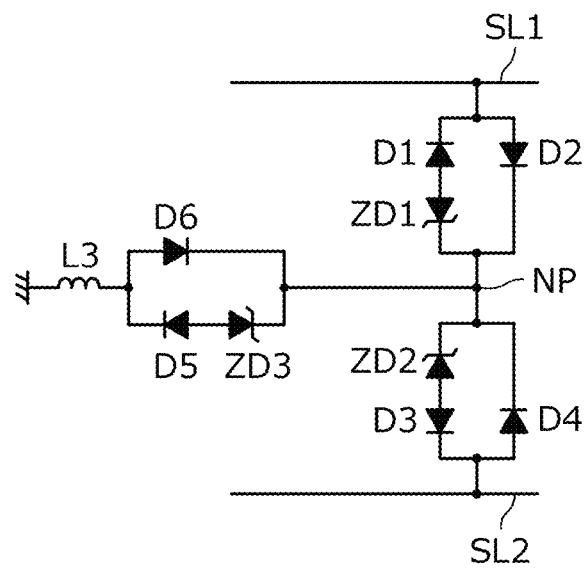

FIGS. 8(A), 8(B), and 8(C) are circuit diagrams of another ESD protection circuit according to the third embodiment. The devices of the ESD protection circuit illustrated in FIG. 8(A) each have a reverse polarity to that of the devices of the ESD protection circuit PC illustrated in FIG. 1. Also, the devices of the ESD protection circuit illustrated in FIGS. 8(B) and 8(C) each have a reverse polarity to that of the devices of the ESD protection circuit PC illustrated in FIGS. 7(A) and 7(B).

Like this, the same characteristics can be obtained even when the polarity of each Zener diode and each diode is reversed.

Fourth Embodiment

In a fourth embodiment, a configuration example of a diode chip including multiple Zener diodes is presented.

Figure 9:
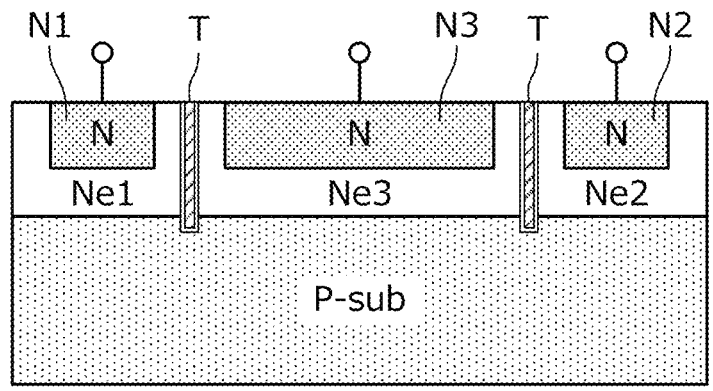
FIG. 9 is a sectional view of a diode chip according to a fourth embodiment.

FIG. 9 is a sectional view of a single diode chip including, for instance, the first Zener diode ZD1, the second Zener diode ZD2, and the third Zener diode ZD3 illustrated in FIG. 1. The diode chip includes a P-type substrate (P-type substrate layer), an N-type epitaxial layer formed on the P-type substrate, N-type diffusion layers N1, N2, and N3 formed in the N-type epitaxial layer, and trenches T for device isolation which reach the P-type substrate from the surface. The epitaxial layer is isolated by the trenches T, and epitaxial layers Ne1, Ne2, and Ne3 are formed. The first Zener diode ZD1 is formed by a junction layer between the P-type substrate and the epitaxial layer Ne1, the second Zener diode ZD2 is formed by a junction layer between the P-type substrate and the epitaxial layer Ne2, and the third Zener diode ZD3 is formed by a junction layer between the P-type substrate and the epitaxial layer Ne3.

Figure 10:
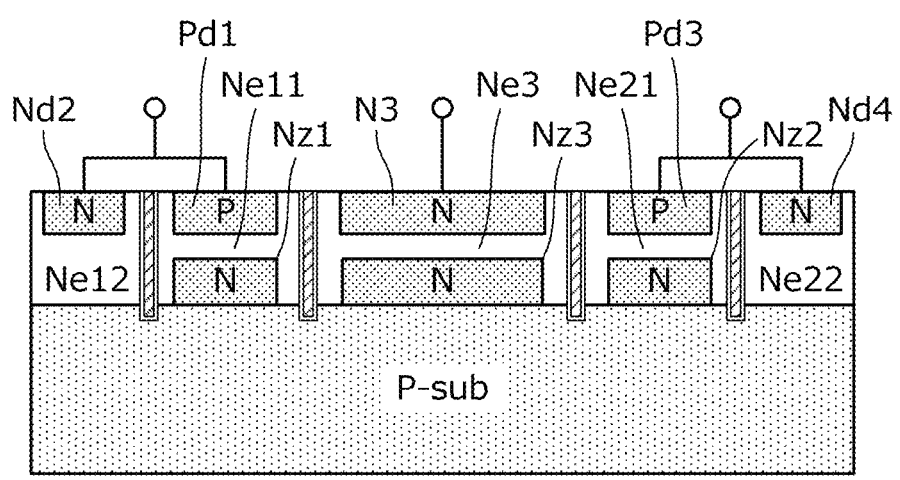
FIG. 10 is a sectional view of another diode chip according to the fourth embodiment.

FIG. 10 is a sectional view of a single diode chip including the first Zener diode ZD1, the second Zener diode ZD2, the third Zener diode ZD3, the first diode D1, the second diode D2, the third diode D3, and the fourth diode D4 illustrated in FIG. 7(A). The diode chip includes a P-type substrate, an N-type epitaxial layer formed on the P-type substrate, N-type diffusion layers and P-type diffusion layers formed in the N-type epitaxial layer, and trenches T for device isolation which reach the P-type substrate from the surface. In FIG. 10, the first Zener diode ZD1 is formed by a junction layer of the P-type substrate and the N-type diffusion layer Nz1, the second Zener diode ZD2 is formed by a junction layer of the P-type substrate and the N-type diffusion layer Nz2, and the third Zener diode ZD3 is formed by a junction layer of the P-type substrate and the N-type diffusion layer Nz3. In addition, the second diode D2 is formed by a junction layer of the P-type substrate and an epitaxial layer Ne12, and the fourth diode D4 is formed by a junction layer of the P-type substrate and an epitaxial layer Ne22. Furthermore, the first diode D1 is formed by a junction layer of an epitaxial layer Ne11 and a P-type diffusion layer Pd1, and the third diode D3 is formed by a junction layer of an epitaxial layer Ne21 and a P-type diffusion layer Pd3.

Figure 11:
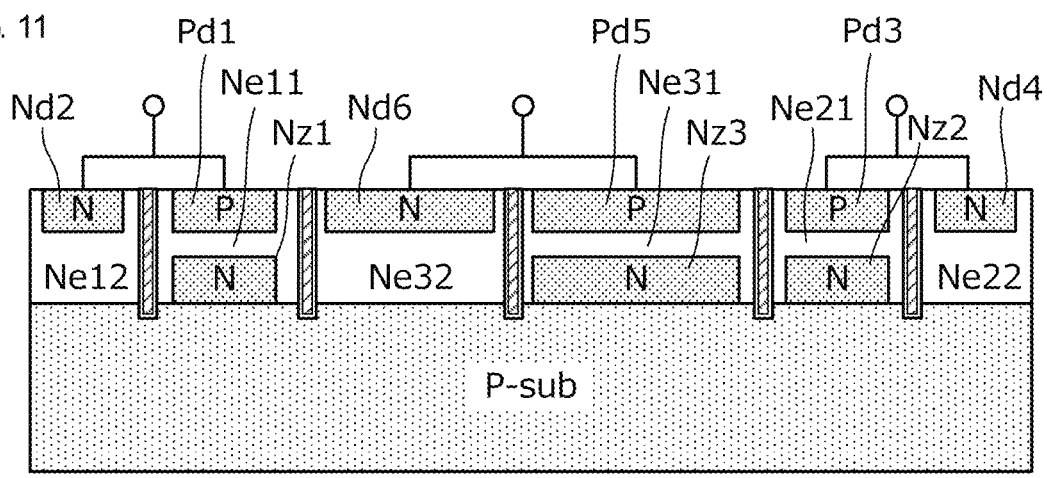
FIG. 11 is a sectional view of still another diode chip according to the fourth embodiment.

FIG. 11 is a sectional view of a single diode chip including the first Zener diode ZD1, the second Zener diode ZD2, the third Zener diode ZD3, the first diode D1, the second diode D2, the third diode D3, the fourth diode D4, the fifth diode D5, and the sixth diode D6 illustrated in FIG. 7(B). In FIG. 11, the third Zener diode ZD3 is formed by a junction layer of the P-type substrate and the N-type diffusion layer Nz3, and the fifth diode D5 is formed by a junction layer of an epitaxial layer Ne31 and a P-type diffusion layer Pd5. Also, the sixth diode D6 is formed by a junction layer of the P-type substrate and an epitaxial layer Ne32. Other components are the same as those illustrated in FIG. 10.

Fifth Embodiment

In a fifth embodiment, an example of a filter formed as a single device is presented.

Figure 12:
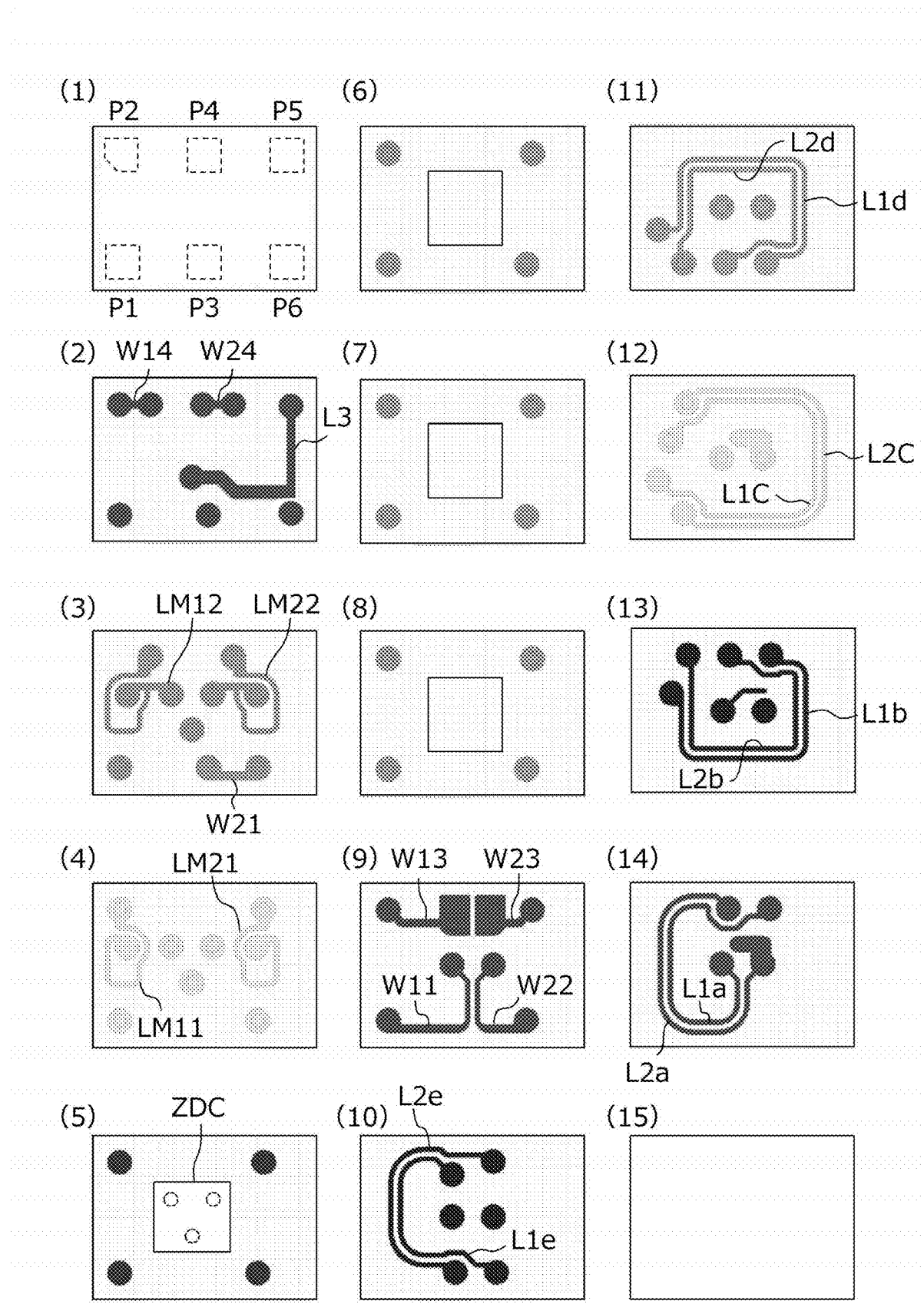
FIG. 12 is a plan view of the layers of a filter according to a fifth embodiment.

FIG. 12 is a plan view of the layers of a filter according to this embodiment. The circuit configuration of the filter is as illustrated in FIG. 5.

In FIG. 12, the first layer (1) is the lowermost layer, and 15th layer (15) is the uppermost layer. Each layer is a nonmagnetic resin layer. External terminals P1 to P6 are formed in the first layer (1). A conductive pattern is formed in each of the second layer (2) to the 14th layer (14). A diode chip ZDC is placed on the fifth layer (5). A cavity formation opening, which houses the diode chip ZDC, is formed in the sixth layer (6) to the eighth layer (8).

In FIG. 12, conductive patterns W11, W13, W14, W21, W22, W23, and W24 are each a wiring pattern. Also, conductive patterns L1a, L1b, L1c, L1d, and L1e are continuous with via conductors interposed therebetween, thereby forming the first inductor L1. Similarly, conductive patterns L2a, L2b, L2c, L2d, and L2e are continuous with via conductors interposed therebetween, thereby forming the second inductor L2. The symbols attached to other conductive patterns correspond to the circuit components illustrated in FIG. 5.

Figure 13:
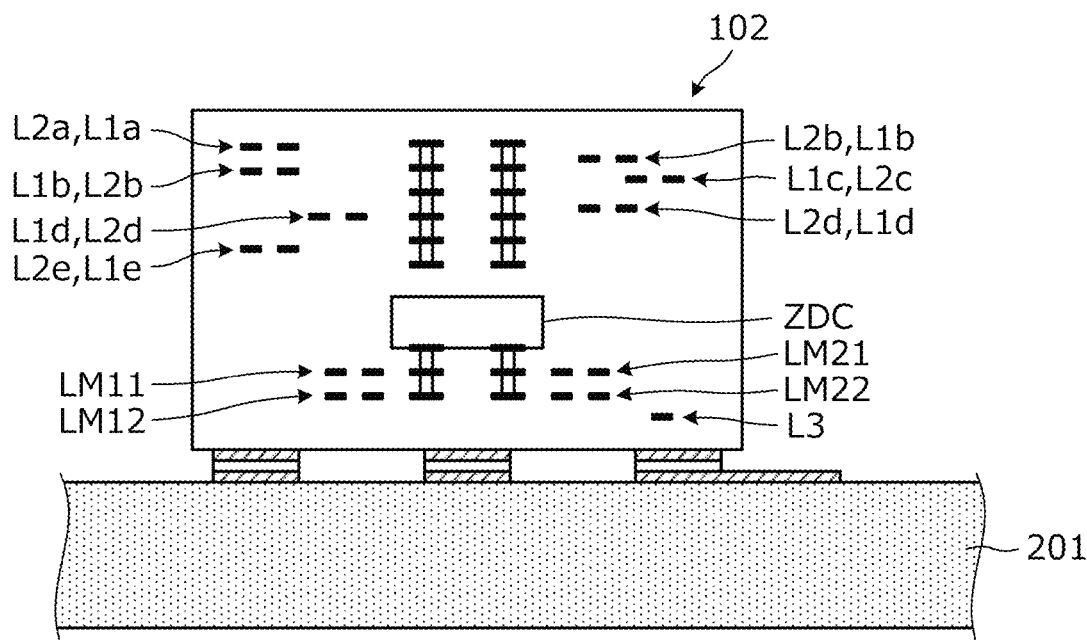
FIG. 13 is a sectional view of a 102 filter mounted on a circuit board 201 according to the fifth embodiment.
Figure 14:
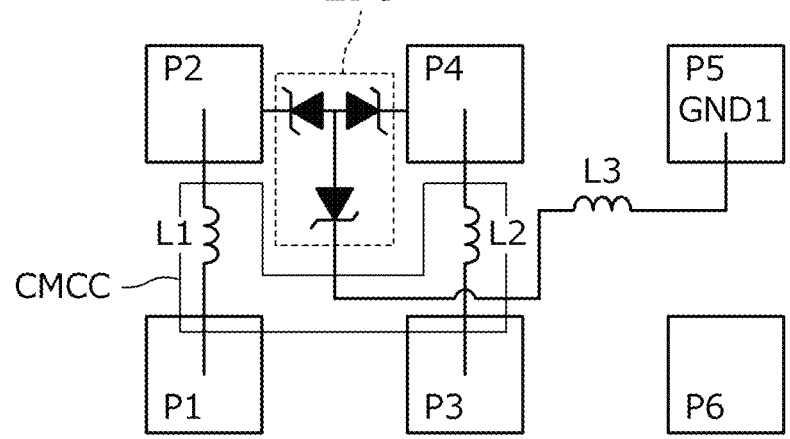
FIG. 14 is a diagram illustrating the circuits connected to the terminals of the filter 102 according to the fifth embodiment.

FIG. 13 is a sectional view of the 102 filter of this embodiment mounted on the circuit board 201. FIG. 14 is a diagram illustrating the circuits connected to the terminals of the filter 102.

In the example illustrated in FIGS. 12 and 13, the ESD protection circuit and the common mode choke coil overlap in plan view of the substrate, and the ESD protection circuit is disposed at a position closer to the input/output terminal (i.e., closer to the lowermost layer) of the substrate than the common mode choke coil is.

Also, in the example illustrated in FIGS. 12 and 13, the third inductor L3 only partially (or hardly) overlaps with the first inductor L1 and the second inductor L2 in plan view of the substrate.

According to this embodiment, the third inductor L3 is formed by a coil-shaped or line-shaped conductive pattern with less than one turn, thus the inductance of the third inductor L3 is not excessively increased, and the resistance component of the third inductor L3 is reduced. Consequently, decrease in the ESD protection performance is reduced.

According to this embodiment, it is preferable that the differential transmission line, the common mode choke coil CMCC, and the ESD protection circuit be provided in or on a single substrate. Consequently, a small-sized filter is formed. In addition, a wire of each portion is shortened, and the parasitic component is reduced. Thus, the filter characteristic of the common mode filter and the ESD protection performance of the EDS protection device are improved.

According to this embodiment, the ESD protection circuit and the common mode choke coil overlap in plan view of the substrate, and the ESD protection circuit is disposed at a position closer to the input/output terminal (closer to the lowermost layer) of the substrate than the common mode choke coil is, and thus when the filter is mounted in a circuit board, the area occupied by the filter is reduced. In addition, the path from the EDS protection device to a ground conductor formed in a circuit board is short, and the parasitic component on the path is low, thus a higher ESD protection performance is obtained.

According to this embodiment, the third inductor L3 hardly overlaps with the first inductor L1 and the second inductor L2 in plan view of the substrate, thus unnecessary coupling between the first inductor L1 and the second inductor L2 via the third inductor L3 does not occur. Also, when an ESD current flows into the third inductor L3, unnecessary induction to the first inductor L1 and the second inductor L2 does not occur.

Sixth Embodiment

In a sixth embodiment, a filter formed by two chip components and a circuit board is presented.

Figure 15:
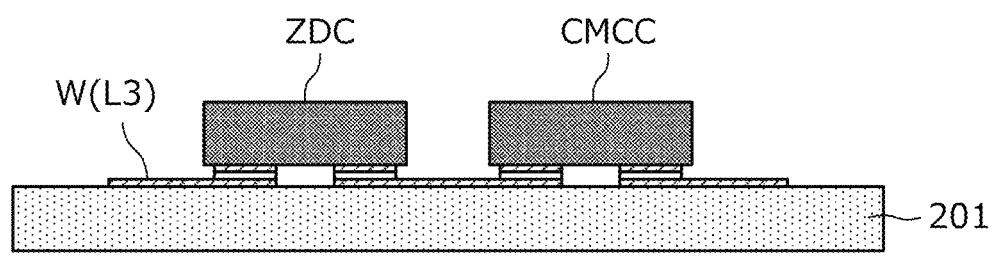
FIG. 15 is a front view of a filter according to a sixth embodiment.

FIG. 15 is a front view of a filter according to the sixth embodiment. The common mode choke coil CMCC and the diode chip ZDC are mounted on the surface of the circuit board 201. The common mode choke coil CMCC is such that the common mode choke coil CMCC illustrated in FIG. 1 is formed as a single chip component. For instance, as illustrated in FIGS. 11 and 7(B), the diode chip ZDC is formed as a single chip component including multiple Zener diodes and multiple diodes. In the circuit board 201, the third inductor L3 is formed by a conductive pattern W (L3). A first end of the third inductor L3 is connected between the third ESD protection device (the circuit formed by the Zener diode ZD3, and the diodes D5, D6) in the diode chip ZDC and the ground.

The third inductor L3 may be formed in the circuit board as in this embodiment.

Seventh Embodiment

In a seventh embodiment, a configuration example of an ESD protection circuit is presented, which is different from the ESD protection circuit illustrated in FIGS. 9, 10, and 11.

Figure 16:
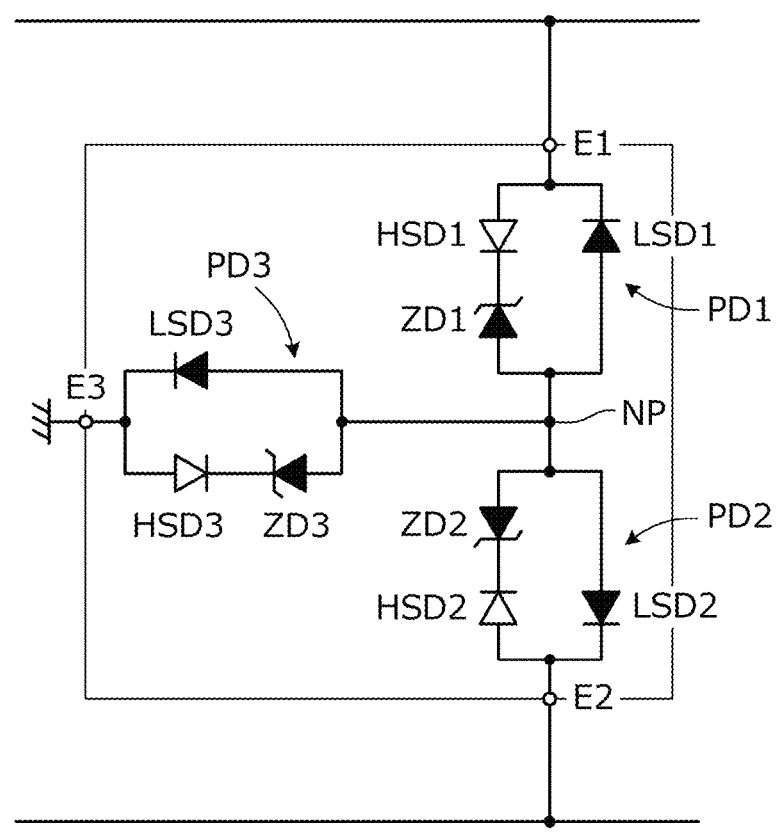
FIG. 16 is a circuit diagram of an ESD protection circuit according to a seventh embodiment.
Figure 17:
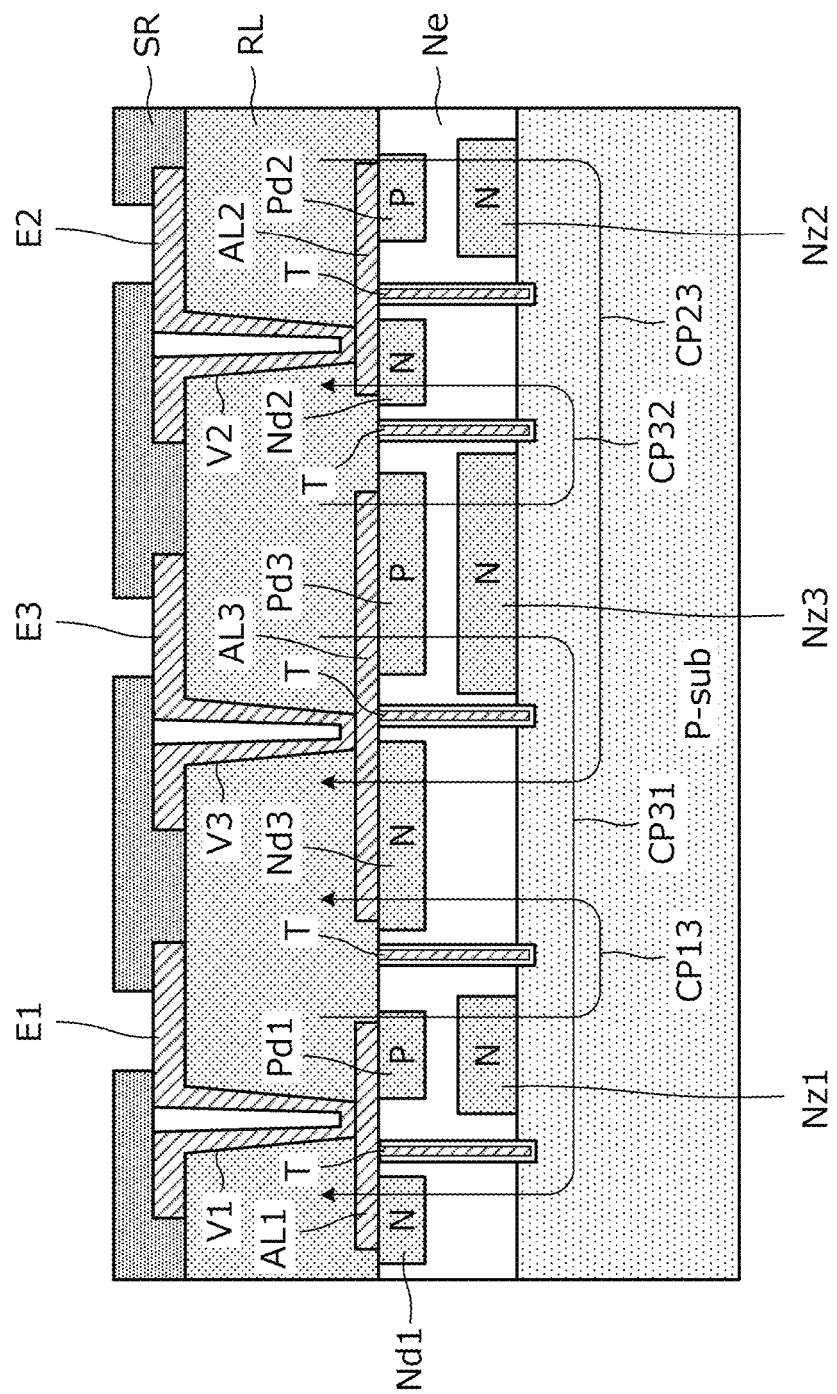
FIG. 17 is a sectional view of a diode chip including an ESD protection circuit according to the seventh embodiment.

FIG. 16 is a circuit diagram of the ESD protection circuit according to the seventh embodiment. FIG. 17 is a sectional view of a diode chip including the ESD protection circuit.

The ESD protection circuit of this embodiment includes a semiconductor substrate in which terminals E1, E2, and E3 are formed. As shown in FIG. 16, the ESD protection circuit includes a first ESD protection device PD1, a second ESD protection device PD2, and a third ESD protection device PD3.

The first ESD protection device PD1 is formed by a first parallel circuit which is connected between the node NP and the first terminal E1 and includes a first high current diode HSD1 and a first low current diode LSD1. The second ESD protection device PD2 is formed by a second parallel circuit which is connected between the node NP and the second terminal E2 and includes a second high current diode HSD2 and a second low current diode LSD2. In addition, the third ESD protection device PD3 is formed by a third parallel circuit which is connected between the node NP and the third terminal E3 and includes a third high current diode HSD3 and a third low current diode LSD3.

Series connection of Zener diode ZD1, ZD2, and ZD3 is performed to above-mentioned high-electric-current diode HSD1, HSD2, and HSD3, respectively.

As shown in FIG. 17, the diode chip includes a P-type substrate (P-type substrate layer) P-sub, an N-type epitaxial layer Ne formed on the P-type substrate, N-type diffusion layer Nz1, Nz2, and Nz3 formed in the epitaxial layer Ne, and trenches T for device isolation which reach the P-type substrate P-sub from the surface. The epitaxial layer Ne is isolated by the trenches T. The first Zener diode ZD1 is formed by a junction layer of the P-type substrate P-sub and the N-type diffusion layer Nz1, the second Zener diode ZD2 is formed by a junction layer of the P-type substrate P-sub and the N-type diffusion layer Nz2, and the third Zener diode ZD3 is formed by a junction layer of the P-type substrate P-sub and the N-type diffusion layer Nz3. In addition, low current diodes LSD1, LSD2, and LSD3 are formed by a junction layer of the P-type substrate P-sub and the epitaxial layer Ne. Furthermore, high current diodes HSD1, HSD2, and HSD3 are formed by junction layers of the epitaxial layer Ne and P-type diffusion layers Pd1, Pd2, and Pd3, respectively.

The N-type diffusion layer Nd1 and the P-type diffusion layer Pd1 are coupled via aluminum wire AL1, the N-type diffusion layer Nd2 and the P-type diffusion layer Pd2 are coupled via aluminum wire AL2, and the N-type diffusion layer Nd3 and the P-type diffusion layer Pd3 are coupled via aluminum wire AL3.

A re-wiring layer RL is formed above the aluminum wires AL1, AL2, and AL3. Terminals E1, E2, E3, and an insulation film SR are formed on the upper surface of the re-wiring layer RL. The terminals E1, E2, and E3 are coupled to the aluminum wires AL1, AL2, and AL3, respectively, with via (interlayer connection conductors) V1, V2, and V3 interposed therebetween. FIG. 17 also shows current paths CP13, CP31, CP23, and CP32, each of which enters through a certain aluminum wire and leaves through another aluminum wire.

In FIG. 17, the structure has been shown by a vertical sectional view of the diode chip. Some examples will be shown below regarding the positional relationship on a plane between the devices of the diode chip.

Figure 18A:
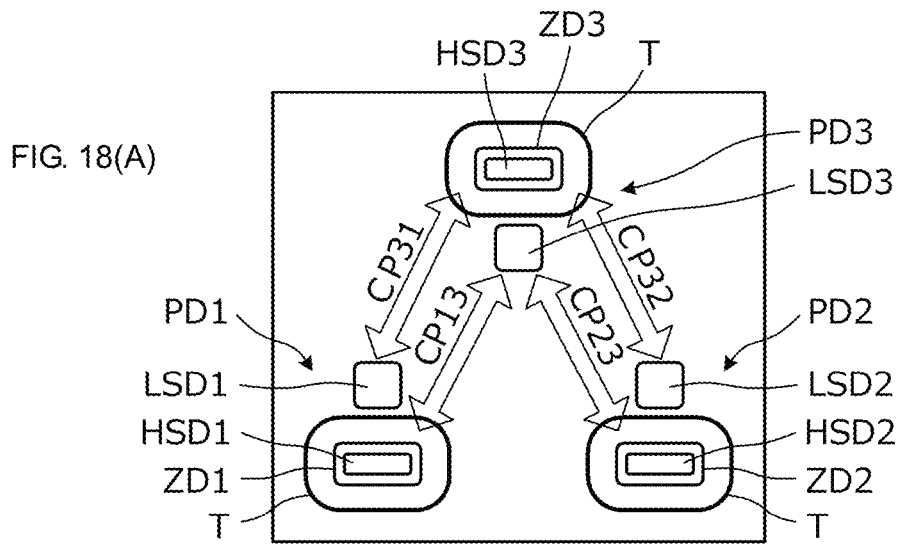
FIGS. 18(A), 18(B), and 18(C) are plan views of the diode chip including the ESD protection circuit according to the seventh embodiment.
Figure 18B:
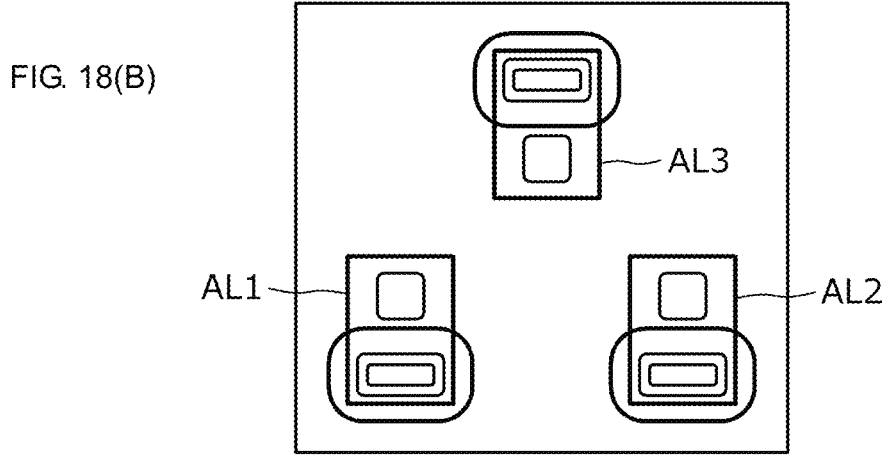
Figure 18C:
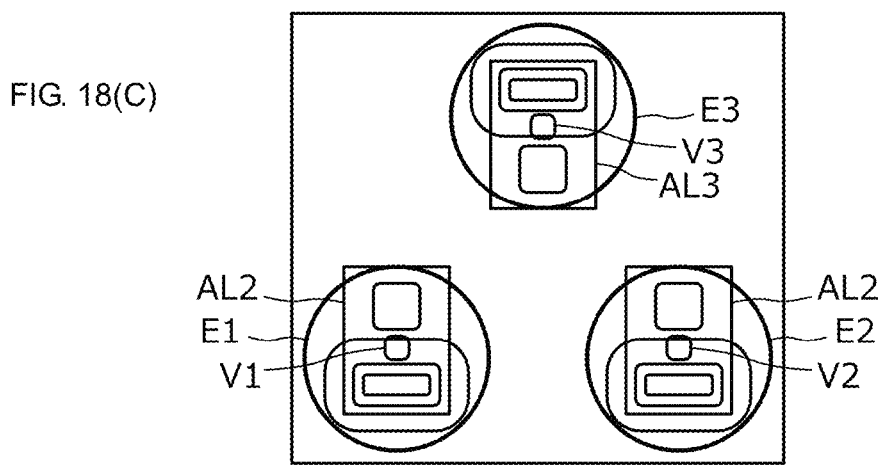

FIGS. 18(A), 18(B), and 18(C) are plan views of the diode chip including the ESD protection circuit according to this embodiment. FIG. 18(A) illustrates the positional relationship between the first ESD protection device PD1, the second ESD protection device PD2, and the third ESD protection device PD3 on a plane. In FIG. 18(B), the aluminum wires AL1, AL2, and AL3 are superimposed and illustrated. In FIG. 18(C), the terminals E1, E2, and E3 and the vias V1, V2, and V3 are further superimposed and illustrated.

In FIG. 18(A), the first low current diode LSD1 corresponds to the formation area of the N-type diffusion layer Nd1 illustrated in FIG. 17, the second low current diode LSD2 corresponds to the formation area of the N-type diffusion layer Nd2 illustrated in FIG. 17, and the third low current diode LSD3 corresponds to the formation area of the N-type diffusion layer Nd3 illustrated in FIG. 17. In addition, the first high current diode HSD1 corresponds to the formation area of the P-type diffusion layer Pd1 illustrated in FIG. 17, the second high current diode HSD2 corresponds to the formation area of the P-type diffusion layer Pd2 illustrated in FIG. 17, and the third high current diode HSD3 corresponds to the formation area of the P-type diffusion layer Pd3 illustrated in FIG. 17. Also, the first Zener diode ZD1 corresponds to the formation area of the N-type diffusion layer Nz1 illustrated in FIG. 17, the second Zener diode ZD2 corresponds to the formation area of the N-type diffusion layer Nz2 illustrated in FIG. 17, and the third Zener diode ZD3 corresponds to the formation area of the N-type diffusion layer Nz3 illustrated in FIG. 17.

As shown in FIG. 18(A), in this example, the first ESD protection device PD1, the second ESD protection device PD2, and the third ESD protection device PD3 are disposed at vertex positions of an approximately equilateral triangle in plan view of the semiconductor substrate.

In the example illustrated in FIGS. 18(A), 18(B), and 18(C), the current path CP13 between the first high current diode HSD1, the first Zener diode ZD1, and the third low current diode LSD3 is long, and the current path CP23 between the second high current diode HSD2, the second Zener diode ZD2, and the third low current diode LSD3 is long. Also, the current path CP31 between the third high current diode HSD3, the third Zener diode ZD3, and the first low current diode LSD1 is long, and the current path CP32 between the third high current diode HSD3, the third Zener diode ZD3, and the second low current diode LSD2 is long.

Figure 19A:
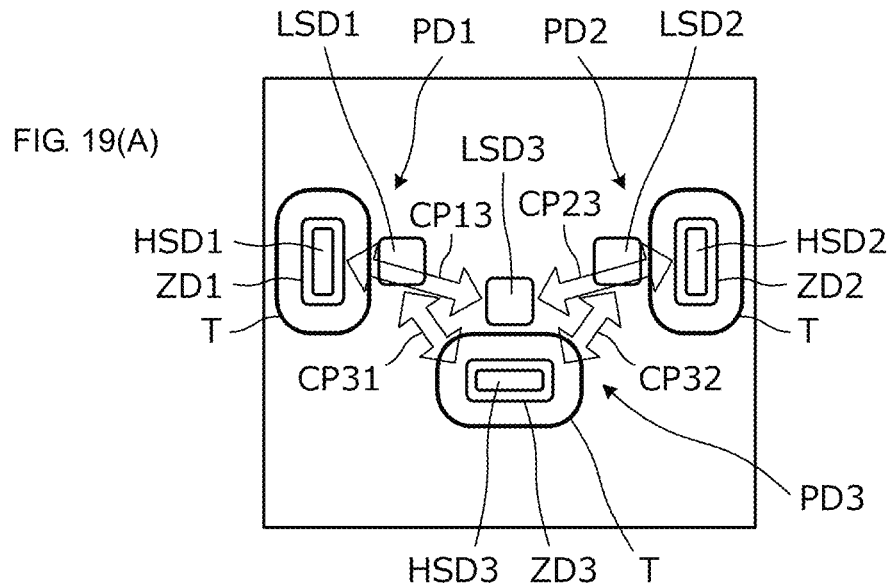
FIGS. 19(A), 19(B), and 19(C) are plan views of another diode chip including the ESD protection circuit according to the seventh embodiment.
Figure 19B:
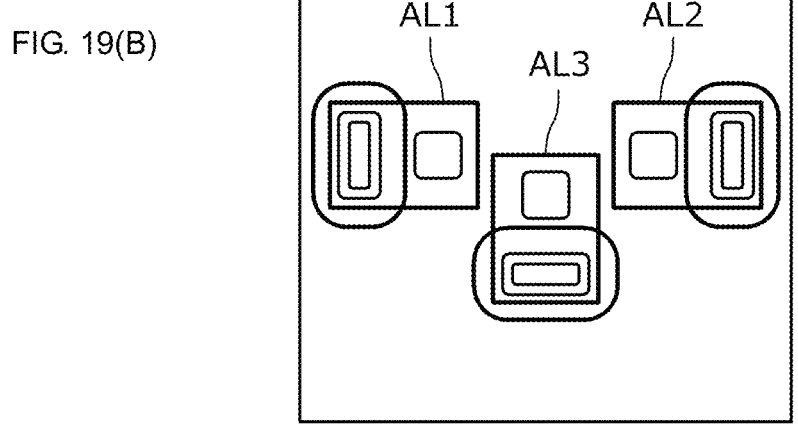
Figure 19C:
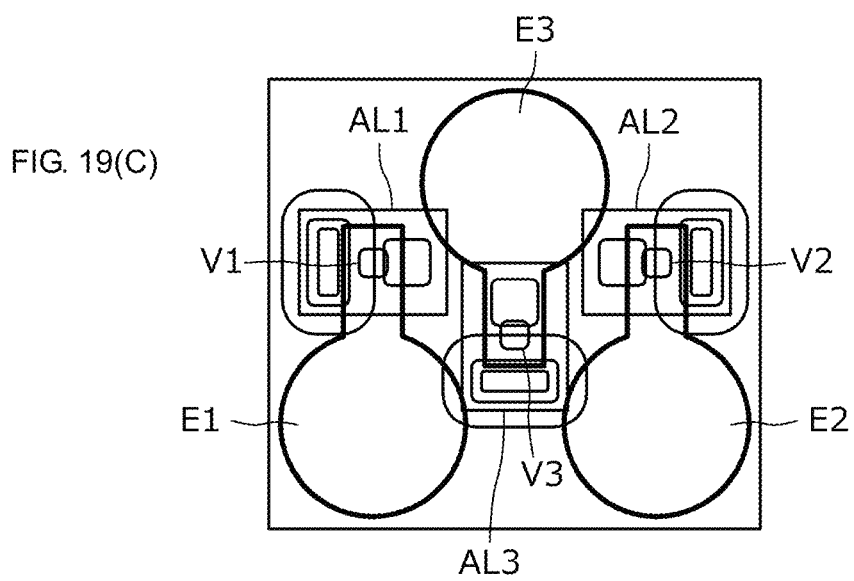

FIGS. 19(A), 19(B), and 19(C) are plan views of another diode chip including the ESD protection circuit according to this embodiment. FIG. 19(A) illustrates the positional relationship between the first ESD protection device PD1, the second ESD protection device PD2, and the third ESD protection device PD3 on a plane. In FIG. 19(B), the aluminum wires AL1, AL2, and AL3 are superimposed and illustrated. In FIG. 19(C), the terminals E1, E2, and E3 and the vias V1, V2, and V3 are further superimposed and illustrated. The relationship between the formation areas of the devices and the diffusion layers is as described based on FIGS. 18(A), 18(B), and 18(C).

In this example, as shown in FIG. 19(C), the first ESD protection device PD1 and the terminal E1, the second ESD protection device PD2 and the terminal E2, and the third ESD protection device PD3 and the terminal E3 are disposed so as not to face each other. Therefore, a parasitic capacitance occurs between them is low.

Also, in the example illustrated in FIGS. 19(A), 19(B), and 19(C), the current path CP13 between the first high current diode HSD1, the first Zener diode ZD1, and the third low current diode LSD3 is long, and the current path CP23 between the second high current diode HSD2, the second Zener diode ZD2, and the third low current diode LSD3 is long. Also, the current path CP31 between the third high current diode HSD3, the third Zener diode ZD3, and the first low current diode LSD1 is long, and the current path CP32 between the third high current diode HSD3, the third Zener diode ZD3, and the second low current diode LSD2 is long.

Figure 20A:
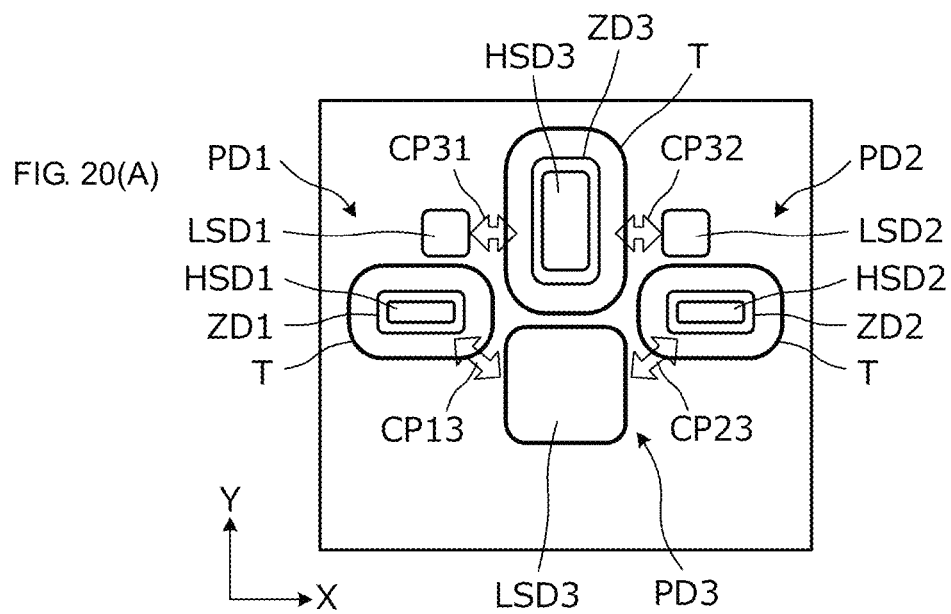
FIGS. 20(A), 20(B), and 20(C) are plan views of still another diode chip including the ESD protection circuit according to the seventh embodiment.
Figure 20B:
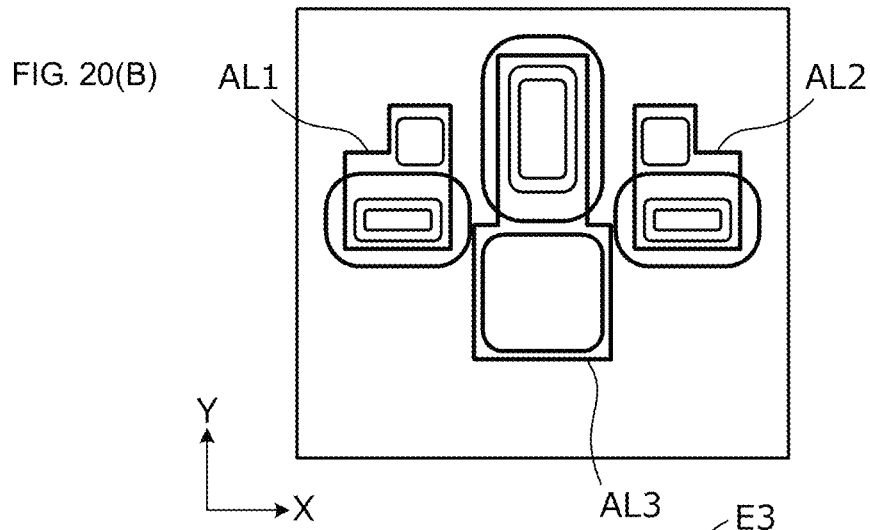
Figure 20C:
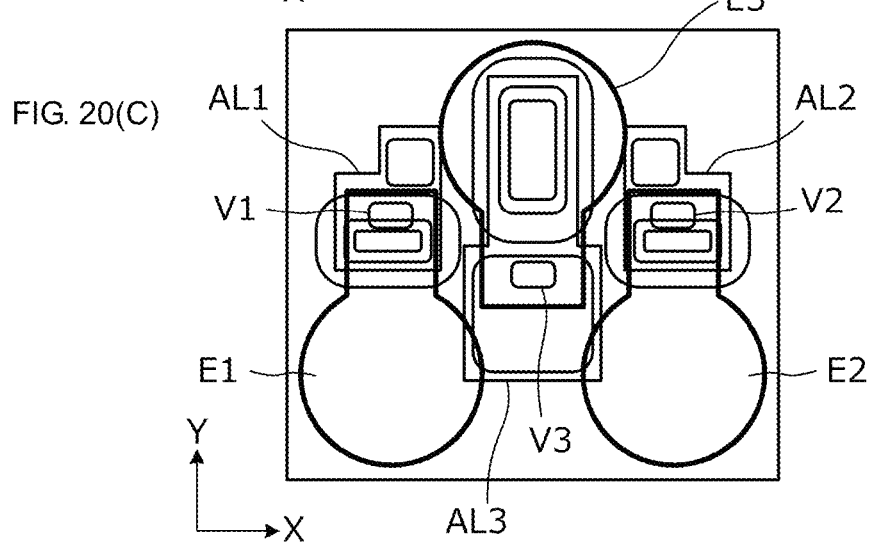

FIGS. 20(A), 20(B), and 20(C) are plan views of still another diode chip including the ESD protection circuit according to this embodiment. FIG. 20(A) illustrates the positional relationship between the first ESD protection device PD1, the second ESD protection device PD2, and the third ESD protection device PD3 on a plane. In FIG. 20(B), the aluminum wires AL1, AL2, and AL3 are superimposed and illustrated. In FIG. 20(C), the terminals E1, E2, and E3 and the vias V1, V2, and V3 are further superimposed and illustrated. The relationship between the formation areas of the devices and the diffusion layers is as described based on FIGS. 18(A), 18(B), and 18(C).

Figure 21:
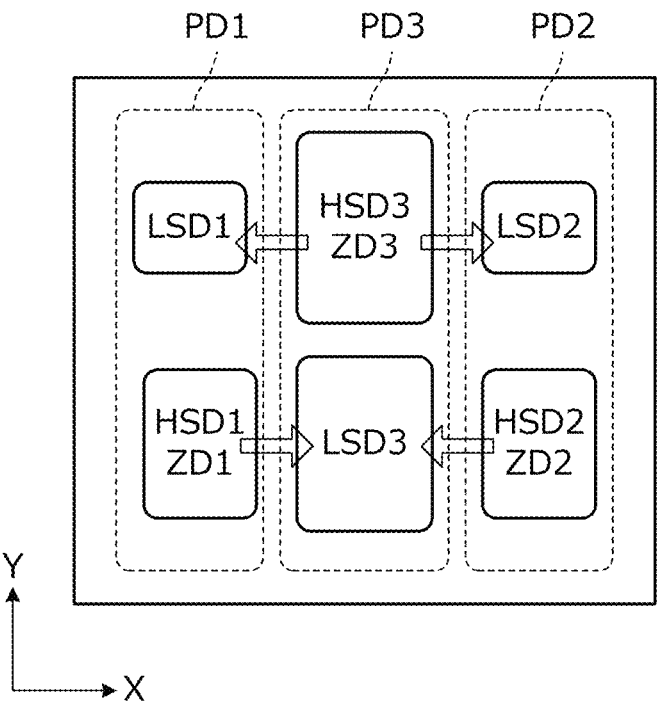
FIG. 21 is a view illustrating a schematic arrangement relationship on a plane between the diodes of the diode chip illustrated in FIGS. 20(A), 20(B), and 20(C).

FIG. 21 is a view illustrating a schematic arrangement relationship on a plane between the diodes of the diode chip. In this example, the first high current diode HSD1 and the first low current diode LSD1 are arranged in the Y-axis direction, the second high current diode HSD2 and the second low current diode LSD2 are arranged in the Y-axis direction, and the third high current diode HSD3 and the third low current diode LSD3 are arranged in the Y-axis direction. The first ESD protection device PD1, the second ESD protection device PD2, and the third ESD protection device PD3 are arranged in the X-axis direction. In other words, the arrangement direction of the high current diodes and the low current diodes, and the arrangement direction of the three ESD protection devices have an orthogonal relationship.

For purposes of the disclosure, "the arrangement direction of the high current diodes and the low current diodes" refers to the direction of the line segment that connects any one point on any high current diode, and any one point on a low current diode connected in parallel with the high current diode in plan view of the semiconductor substrate. In other words, "the arrangement direction of the high current diodes and the low current diodes" refers to the direction of the line segment that connects a high current diode and a low current diode to be connected in parallel with each other in plan view of the semiconductor substrate. The direction is, for instance, the Y-axis direction in FIG. 21.

In the example of FIGS. 20(A), 20(B), and 20(C), the high current diode is the first high current diode HSD1 or the second high current diode HSD2, or the third high current diode HSD3. In the example of FIGS. 20(A), 20(B), and 20(C), the low current diode is the first low current diode LSD1 or the second low current diode LSD2, or the third low current diode LSD3.

Also, in the example of FIGS. 20(A), 20(B), and 20(C), "the arrangement direction of the three ESD protection devices" refers to the direction of any line that crosses through all of a first line segment, a second line segment, and a third line segment in plan view of the semiconductor substrate, the first line segment connecting the first high current diode HSD1 and the first low current diode LSD1, the second line segment connecting the second high current diode HSD2 and the second low current diode LSD2, the third line segment connecting the third high current diode HSD3 and the third low current diode LSD3. The direction is, for instance, the X-axis direction in FIG. 21.

Furthermore, it is noted that "the arrangement direction of the high current diodes and the low current diodes, and the arrangement direction of the three ESD protection devices have an orthogonal relationship" does not only refer to the orthogonal relationship in a strict sense, but may refer to substantially orthogonal relationship, and more specifically, means that the arrangement direction of the high current diodes and the low current diodes, and the arrangement direction of the three ESD protection devices form an angle of 45° or greater and 90° or less.

In plan view of the semiconductor substrate, the third low current diode LSD3 is formed in the area between the first high current diode HSD1 and the second high current diode HSD2, and the third high current diode HSD3 is formed in the area between the first low current diode LSD1 and the second low current diode LSD2.

In the example of FIGS. 20(A), 20(B), and 20(C), the current path CP13 between the first high current diode HSD1, the first Zener diode ZD1, and the third low current diode LSD3 is shorter, and the current path CP23 between the second high current diode HSD2, the second Zener diode ZD2, and the third low current diode LSD3 is shorter, as compared with, for instance, the examples illustrated in FIGS. 18(A), 18(B), and 18(C), and FIGS. 19(A), 19(B), and 19(C). In addition, the current path CP31 between the third high current diode HSD3, the third Zener diode ZD3, and the first low current diode LSD1 is shorter, and the current path CP32 between the third high current diode HSD3, the third Zener diode ZD3, and the second low current diode LSD2 is shorter. Consequently, the resistance value (ON resistance) at the time of ON of each diode is becomes low, an ESD current flows efficiently, and the clamping voltage at the time of ESD protection operation is further reduced.

In the example of FIGS. 20(A), 20(B), and 20(C), the distance from a node between the first high current diode HSD1 and the first low current diode LSD1 to a node between the second high current diode HSD2 and the second low current diode LSD2 is short, thus overall miniaturization is possible.

Also, in contrast to the example of FIGS. 19(A), 19(B), and 19(C), in the example of FIGS. 20(A), 20(B), and 20(C), the current path CP13 and the current path CP31 do not cross, and the current path CP23 and the current path CP32 do not cross. Therefore, unnecessary coupling between these current paths hardly occurs, and superposition of an ESD current on the current path is extremely small.

Also, in the example of FIGS. 20(A), 20(B), and 20(C), the formation area of the third high current diode HSD3 is larger than the formation area of the first high current diode HSD1 and the formation area of the second high current diode HSD2. In addition, the formation area of the third low current diode LSD3 is larger than the formation area of the first low current diode LSD1 and the formation area of the second low current diode LSD2. Furthermore, the formation area of the third Zener diode ZD3 is larger than the formation area of the first Zener diode ZD1 and the formation area of the second Zener diode ZD2. Therefore, the ON resistances of the third high current diode HSD3, the third low current diode LSD3, and the third Zener diode ZD3 are reduced, and the clamping voltage at the time of ESD protection operation is further reduced. In particular, the third high current diode HSD3 and the third low current diode LSD3 can be formed in a relatively large size, thus the effect of reduction of the clamping voltage at the time of ESD protection operation is increased.

Eighth Embodiment

In an eighth embodiment, a configuration example of an ESD protection circuit including a Zener diode as the third ESD protection device is presented.

Figure 22:
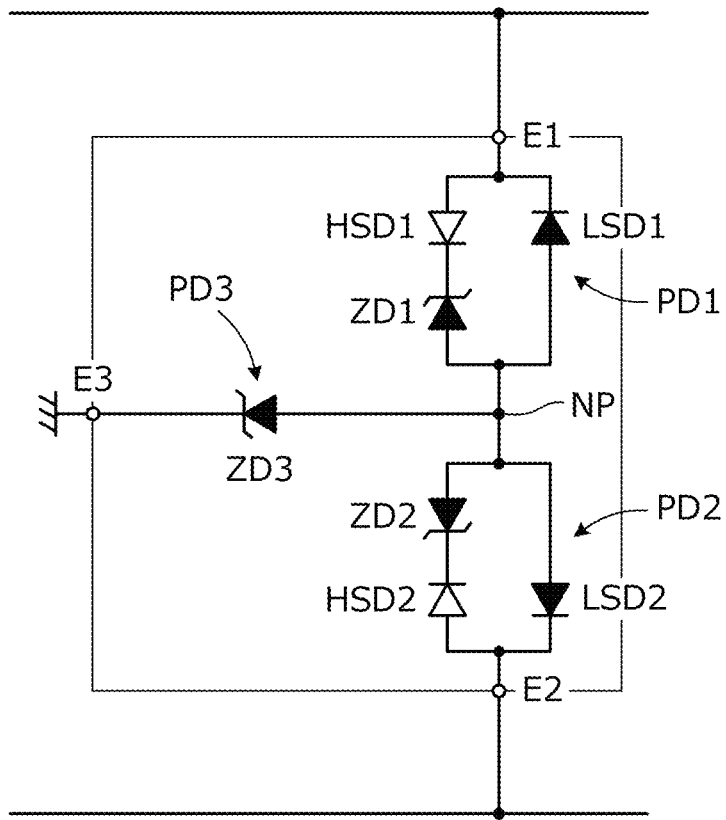
FIG. 22 is a circuit diagram of an ESD protection circuit according to an eighth embodiment.
Figure 23:
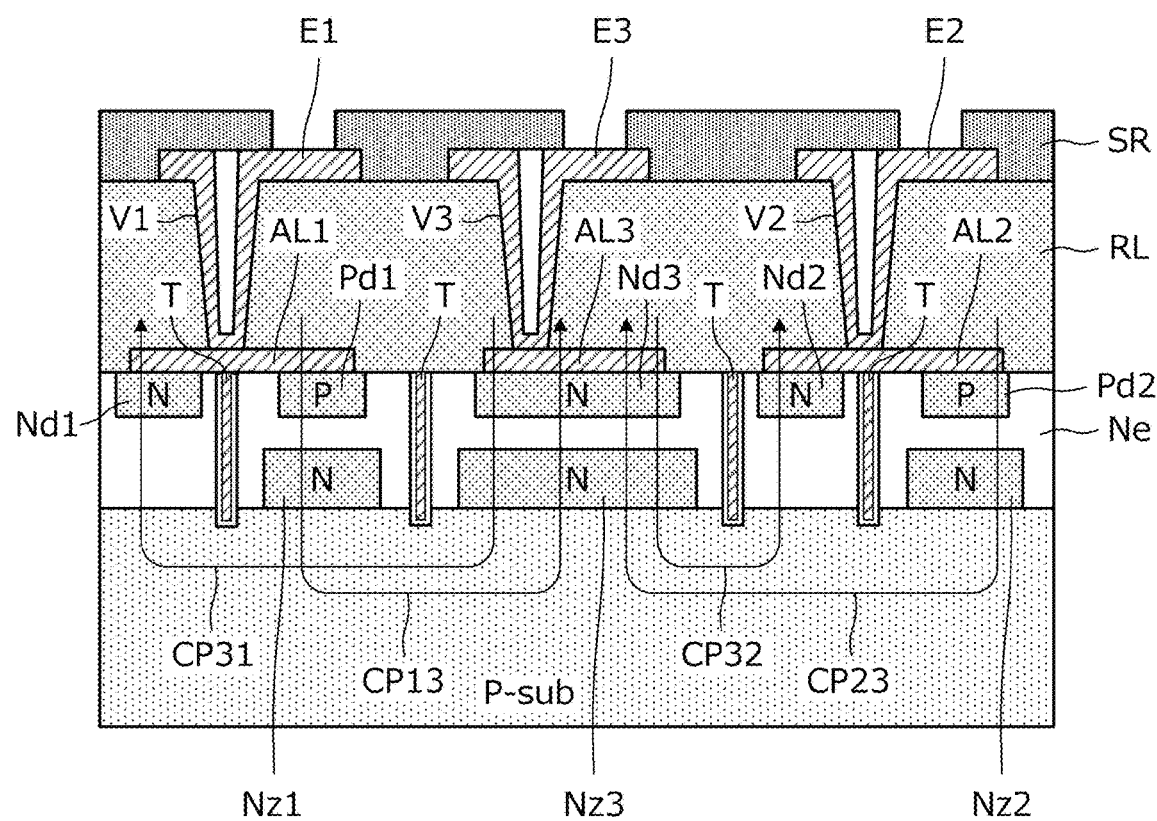
FIG. 23 is a sectional view of a diode chip including the ESD protection circuit according to the eighth embodiment.

FIG. 22 is a circuit diagram of an ESD protection circuit according to the eighth embodiment. FIG. 23 is a sectional view of a diode chip including the ESD protection circuit.

The ESD protection circuit in this embodiment includes a semiconductor substrate in which terminals E1, E2, and E3 are formed. As shown in FIG. 22, the ESD protection circuit includes a first ESD protection device PD1, a second ESD protection device PD2, and a third ESD protection device PD3.

The third ESD protection device PD3 is formed by a third Zener diode ZD3 connected between a node NP and the third terminal E3. Other components are the same as those of the ESD protection circuit illustrated in FIG. 16.

As shown in FIG. 23, the diode chip includes a P-type substrate (P-type substrate layer) P-sub, an N-type epitaxial layer Ne formed on the P-type substrate, N-type diffusion layers Nz1, Nz2, and Nz3 formed in the epitaxial layer Ne, and trenches T for device isolation which reach the P-type substrate P-sub from the surface. The epitaxial layer Ne is isolated by the trenches T. The third Zener diode ZD3 is formed by a junction layer of the P-type substrate P-sub and the N-type diffusion layer Nz3. The epitaxial layer Ne and the N-type diffusion layer Nd3 is formed as the current path of the Zener diode. Other components are the same as those of the ESD protection circuit illustrated in FIG. 17.

Some examples will be shown below regarding the positional relationship on a plane between the devices of the diode chip in this embodiment.

Figure 24A:
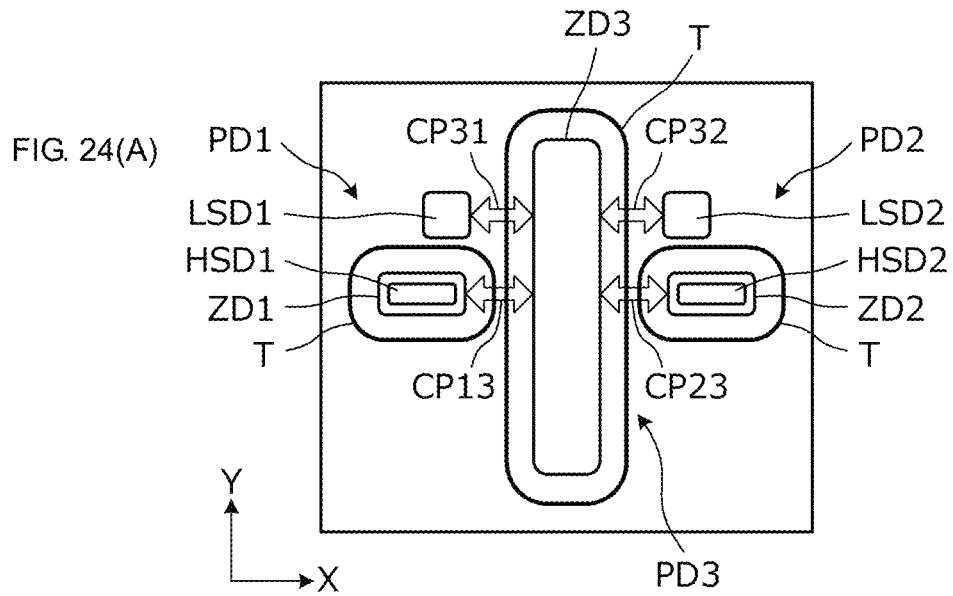
FIGS. 24(A), 24(B), and 24(C) are plan views of the diode chip including the ESD protection circuit according to the eighth embodiment.
Figure 24B:
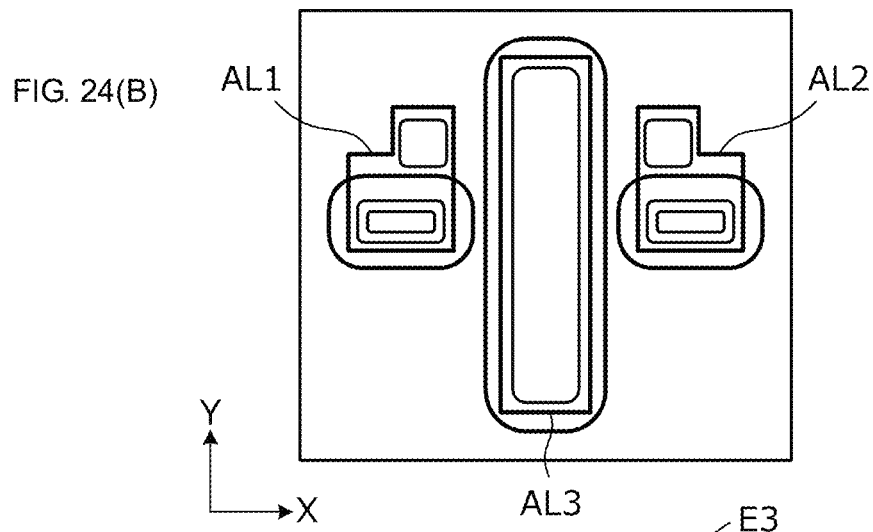
Figure 24C:
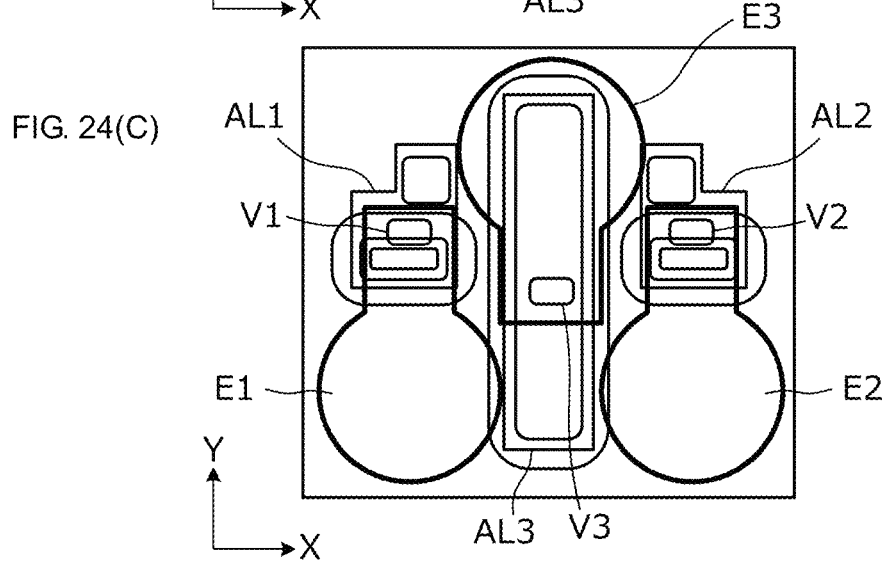

FIGS. 24(A), 24(B), and 24(C) are plan views of the diode chip including the ESD protection circuit in this embodiment. FIG. 24(A) illustrates the positional relationship on a plane between the first ESD protection device PD1, the second ESD protection device PD2, and the third ESD protection device PD3. In FIG. 24(B), the aluminum wires AL1, AL2, and AL3 are superimposed and illustrated. In FIG. 24(C), the terminals E1, E2, and E3 and the vias V1, V2, and V3 are further superimposed and illustrated. The relationship between the formation areas of the devices and the diffusion layers is as described based on FIGS. 18(A), 18(B), and 18(C).

In plan view of the semiconductor substrate, the third Zener diode ZD3 is formed in the area between the first high current diode HSD1 and the second high current diode HSD2, and in the area between the first low current diode LSD1 and the second low current diode LSD2.

In this example, the third ESD protection device PD3 is formed by the Zener diode ZD3 having a large area, thus the clamping voltage at the time of ESD protection operation is low. As shown in FIG. 24(C), the first ESD protection device PD1 and the terminal E1, and the second ESD protection device PD2 and the terminal E2 are disposed so as not to face each other. Therefore, a parasitic capacitance occurs between them is low.

In this example, the third ESD protection device PD3 is formed in the area in the epitaxial layer Ne and between the first ESD protection device PD1 and the second ESD protection device PD2. The first high current diode HSD1 and the first low current diode LSD1 are arranged in the Y-axis direction, and the second high current diode HSD2 and the second low current diode LSD2 are arranged in the Y-axis direction. The first ESD protection device PD1, the second ESD protection device PD2, and the third ESD protection device PD3 are arranged in the X-axis direction. In other words, the arrangement direction of the high current diodes and the low current diodes, and the arrangement direction of the three ESD protection devices have an orthogonal relationship.

Here, as described above, "the arrangement direction of the high current diodes and the low current diodes" refers to the direction of the line segment that connects any one point on any high current diode, and any one point on a low current diode connected in parallel with the high current diode in plan view of the semiconductor substrate. The direction is, for instance, the Y-axis direction in FIGS. 24(A), 24(B), and 24(C).

Also, for instance, in the example of FIGS. 24(A), 24(B), and 24(C), "the arrangement direction of the three ESD protection devices" refers to the direction of any line that crosses through all of a first line segment connecting the first high current diode HSD1 and the first low current diode LSD1, a second line segment connecting the second high current diode HSD2 and the second low current diode LSD2, and the third Zener diode ZD3 in plan view of the semiconductor substrate. The direction is, for instance, the X-axis direction in FIGS. 24(A), 24(B), and 24(C).

Furthermore, "the arrangement direction of the high current diodes and the low current diodes, and the arrangement direction of the three ESD protection devices have an orthogonal relationship" does not only refer to the orthogonal relationship in a strict sense, but may refer to substantially orthogonal relationship. More specifically, means that the arrangement direction of the high current diodes and the low current diodes, and the arrangement direction of the three ESD protection devices form an angle of 45° or greater and 90° or less.

Figure 25A:
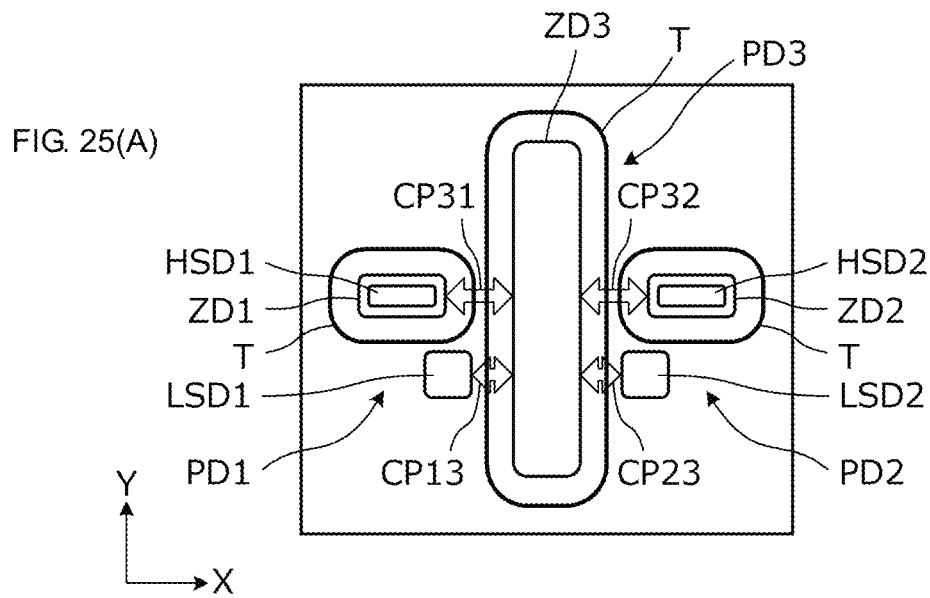
FIGS. 25(A), 25(B), and 25(C) are plan views of another diode chip including the ESD protection circuit according to the eighth embodiment.
Figure 25B:
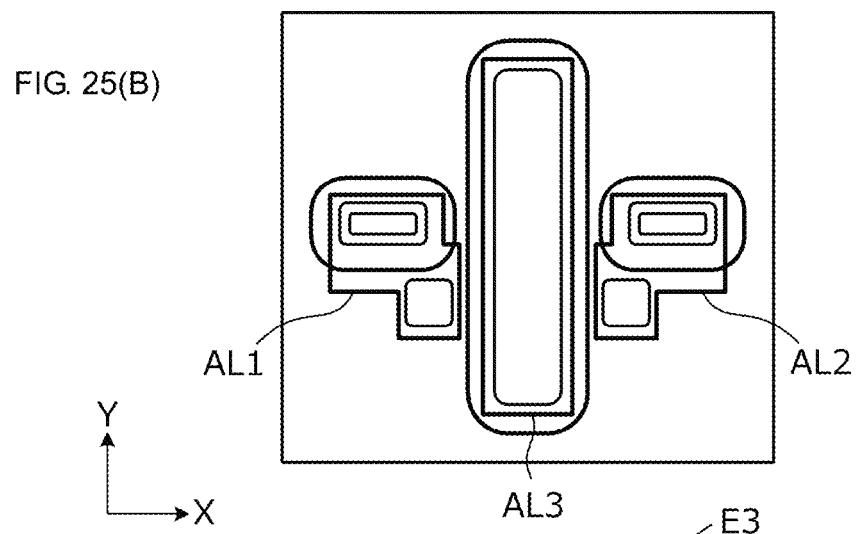
Figure 25C:
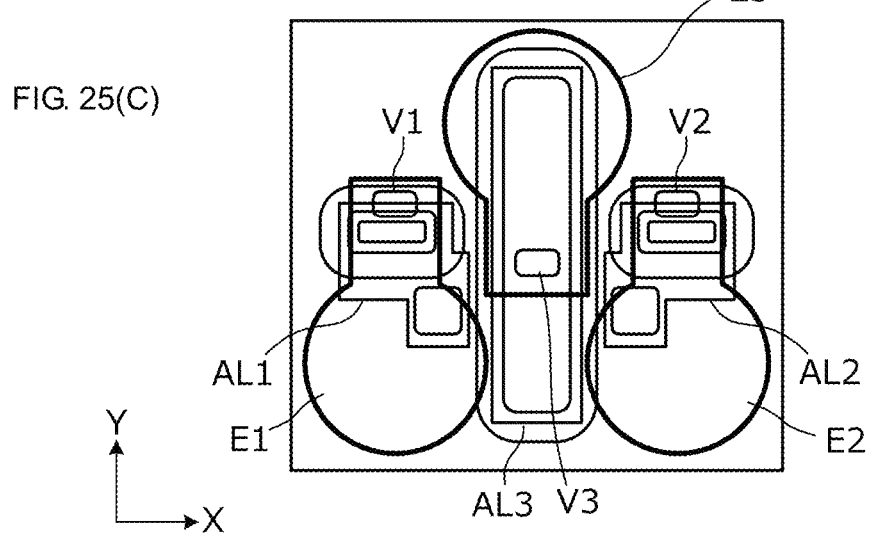

FIGS. 25(A), 25(B), and 25(C) are plan views of another diode chip including the ESD protection circuit according to this embodiment. FIG. 25(A) illustrates the positional relationship on a plane between the first ESD protection device PD1, the second ESD protection device PD2, and the third ESD protection device PD3. In FIG. 25(B), the aluminum wires AL1, AL2, and AL3 are superimposed and illustrated. In FIG. 25(C), the terminals E1, E2, and E3 and the vias V1, V2, and V3 are further superimposed and illustrated. The relationship between the formation areas of the devices and the diffusion layers is as described based on FIGS. 18(A), 18(B), and 18(C).

In this example, a positional relationship between the first high current diode HSD1 and the first low current diode LSD1, and a positional relationship between the second high current diode HSD2 and the second low current diode LSD2 are reversed to what has been illustrated in FIGS. 24(A), 24(B), and 24(C).

In this example, as shown in FIG. 25(C), the current path of the first high current diode HSD1→the first Zener diode ZD1→the terminal E1 is short, and the current path of the second high current diode HSD2→the second Zener diode ZD2→the terminal E2 is also short. Therefore, the voltage drop is small in these current paths at the time of ESD protection operation, and the clamping voltage at the time of ESD protection operation is low.

Ninth Embodiment

In a ninth embodiment, an ESD protection circuit formed as a single device and the mounting structure are presented.

Figure 26A:
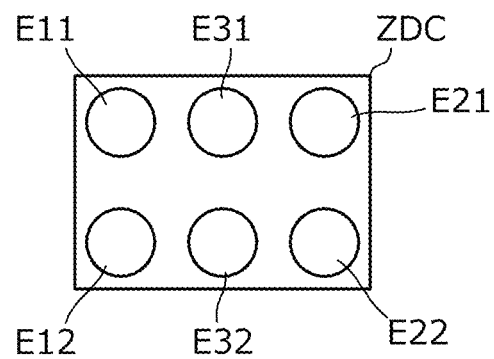
FIG. 26(A) is a plan view illustrating an electrode arrangement of a diode chip according to a ninth embodiment.
Figure 26B:
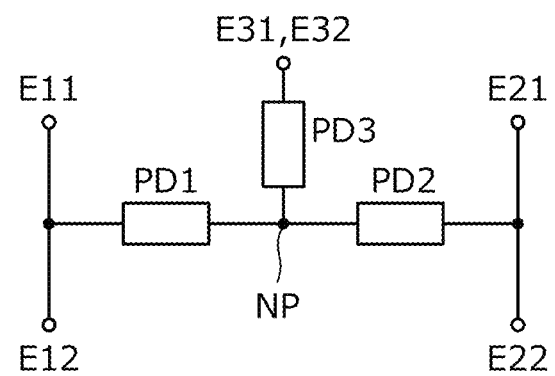
FIG. 26(B) is a circuit diagram of the diode chip.

FIG. 26(A) is a plan view illustrating an electrode arrangement of a diode chip according to the ninth embodiment. FIG. 26(B) is a circuit diagram of the diode chip.

The ESD protection circuit included in a diode chip ZDC in this embodiment is as illustrated in FIGS. 16 and 22, for instance. The terminals E11 and E12 are electrically continuous inside, and the first ESD protection device PD1 is connected between the terminals E11, E12 and the nodes NP. Similarly, the terminals E21 and E22 are electrically continuous inside, and the second ESD protection device PD2 is connected between the terminals E21, E22 and the nodes NP. Also, the terminals E31 and E32 are electrically continuous inside, and the third ESD protection device PD3 is connected between the terminals E31, E32 and the nodes NP.

Figure 27A:
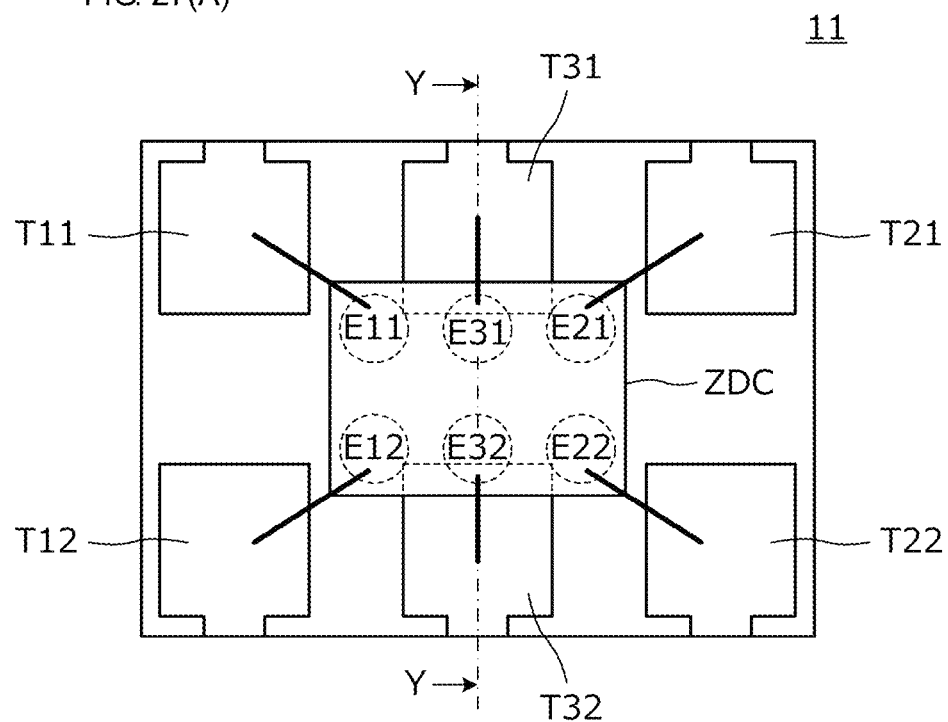
FIG. 27(A) is a plan view illustrating the internal structure of an ESD protection device including the diode chip ZDC according to the ninth embodiment.
Figure 27B:
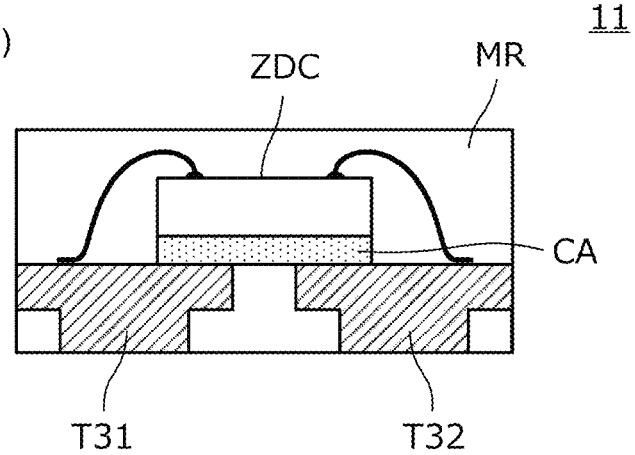
FIG. 27(B) is a vertical sectional view of the ESD protection device.

FIG. 27(A) is a plan view illustrating the internal structure of the ESD protection device including the diode chip ZDC. FIG. 27(B) is a vertical sectional view of the ESD protection device.

The configuration of the diode chip ZDC provided in the ESD protection device 11 in this embodiment is as illustrated in FIGS. 26(A) and 26(B). The ESD protection device 11 is a device in which the diode chip ZDC is die-bonded to a lead frame, and each electrode of the diode chip ZDC is wire-bonded to the lead frame. In the example illustrated in FIG. 27(A), terminals E11, E12, E21, E22, E31, and E32 of the diode chip ZDC are coupled to respective terminals T11, T12, T21, T22, T31, and T32 of the lead frame via a wire.

Figure 28:
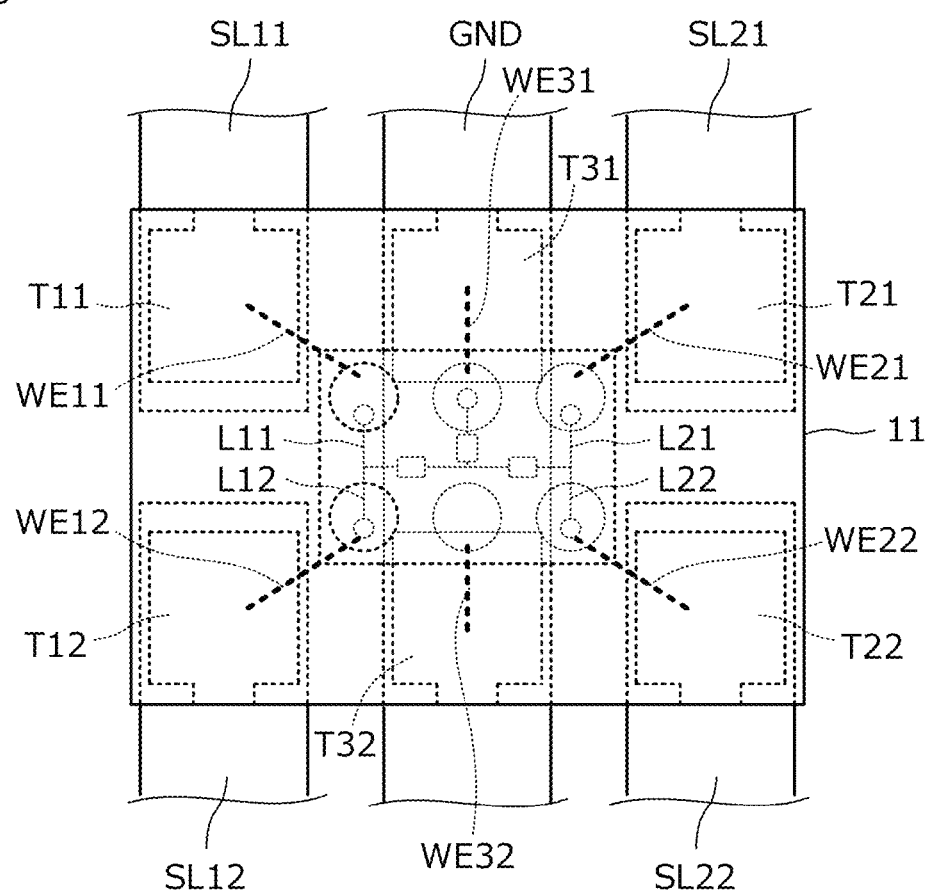
FIG. 28 is a plan view illustrating the structure of coupling of the ESD protection device 11 according to the ninth embodiment to signal lines or the like on the circuit board.
Figure 29:
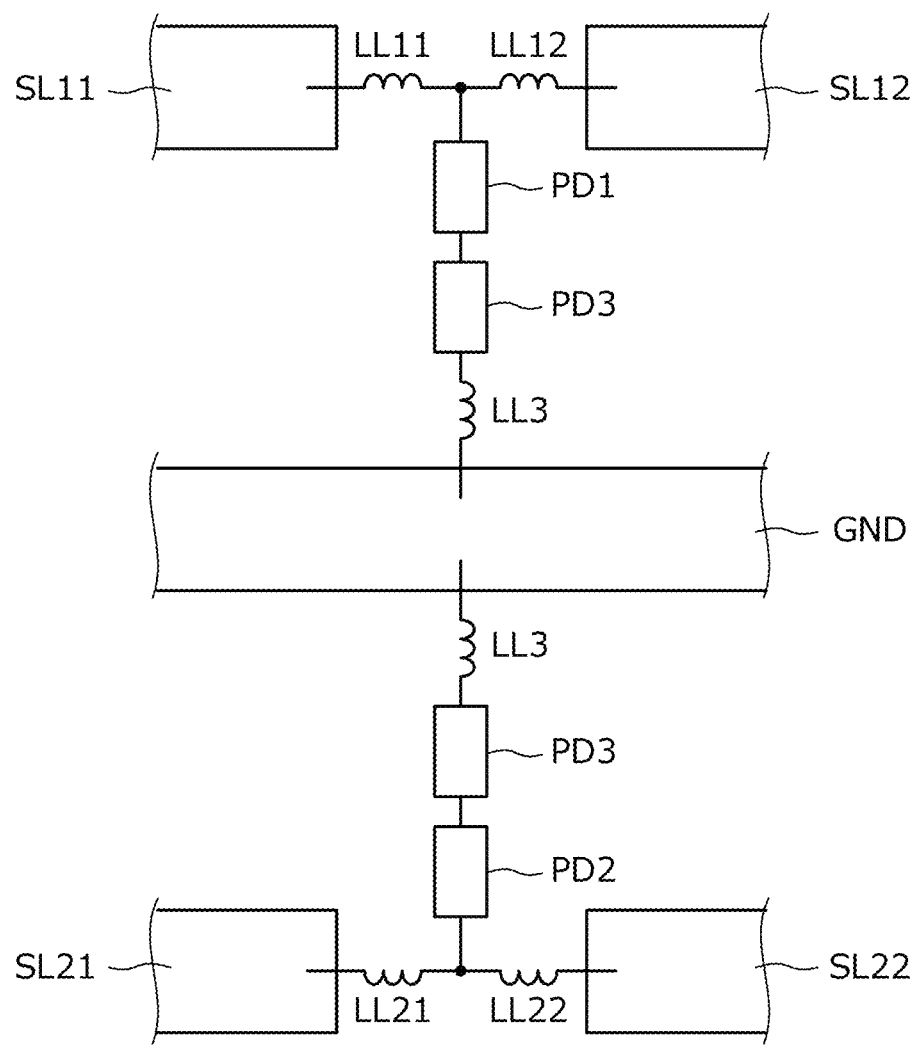
FIG. 29 is an equivalent circuit diagram for the structure illustrated in FIG. 28.

FIG. 28 is a plan view illustrating the structure of coupling of the ESD protection device 11 to signal lines or the like on the circuit board. FIG. 29 is an equivalent circuit diagram for the structure illustrated in FIG. 28.

In FIG. 28, the first signal lines SL11, SL12 are isolated on the circuit board, and are coupled via the terminals T11, T12 of the ESD protection device 11. Similarly, the second signal lines SL21, SL22 are isolated on the circuit board, and are coupled via the terminals T21, T22 of the ESD protection device 11. The terminals T31, T32 of the ESD protection device 11 are connected to ground pattern GND.

As shown in FIG. 29, a parasitic inductance denoted by an inductor LL11 occurs between the first signal line SL11 and the first ESD protection device PD1, and a parasitic inductance denoted by an inductor LL12 occurs between the first signal line SL12 and the first ESD protection device PD1. Similarly, a parasitic inductance denoted by an inductor LL21 occurs between the second signal line SL21 and the second ESD protection device PD2, and a parasitic inductance denoted by an inductor LL22 occurs between the second signal line SL22 and the second ESD protection device PD2. In addition, a parasitic inductance denoted by an inductor LL3 occurs between the ground pattern GND and the third ESD protection device PD3. In each of the first ESD protection device PD1, the second ESD protection device PD2, and the third ESD protection device PD3, a parasitic capacitance occurs at OFF time when an application voltage is lower than or equal to an operating voltage.

The inductor LL11 in FIG. 29 is the inductor including the wire WE11 and the current path L11 in FIG. 28. Similarly, the inductor LL12 is the inductor including the wire WE12 and the current path L12 in FIG. 28. The inductor LL3 is the inductor including the wires WE31, WE32 in FIG. 28, and current paths connected to these wires. The same description for the inductors of the first signal line is applied to the inductors of the second signal lines SL21, SL22.

In this manner, a series resonance circuit is formed by the parasitic capacitances of the first ESD protection device PD1 and the third ESD protection device PD3, and the parasitic inductance denoted by the inductor LL3, and a series resonance circuit is formed by the parasitic capacitances of the second ESD protection device PD2 and the third ESD protection device PD3, and the parasitic inductance denoted by the inductor LL3.

Figure 30:
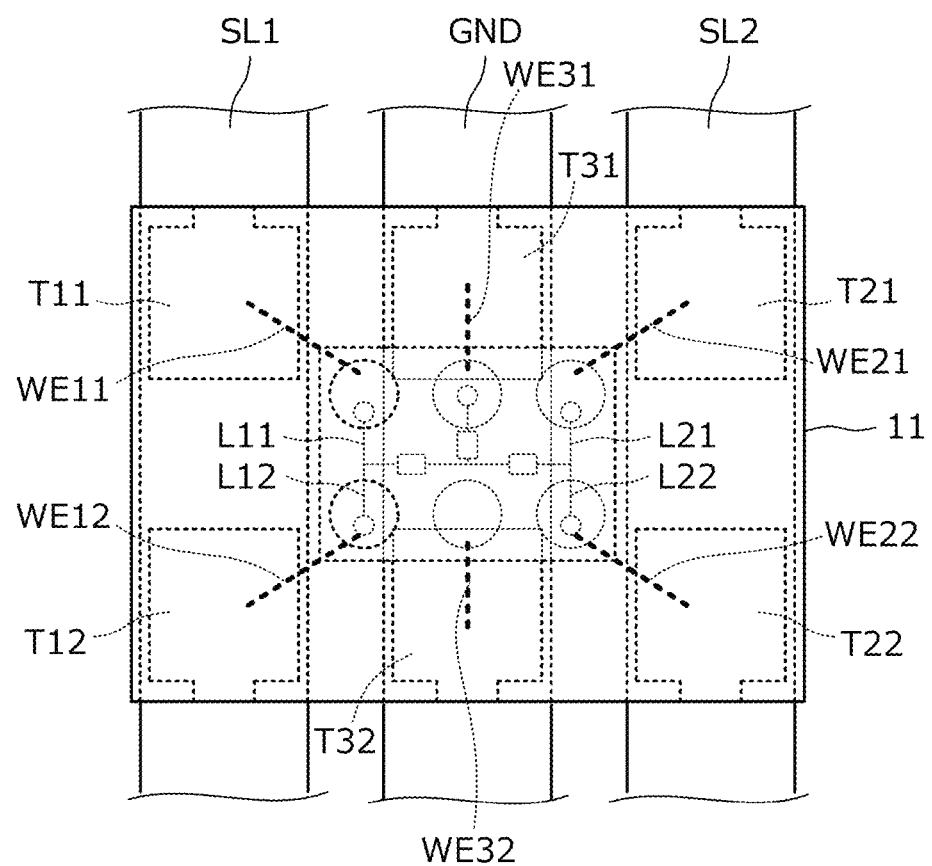
FIG. 30 is a plan view illustrating the structure of coupling of the ESD protection device 11 to signal lines or the like on a circuit board different from the circuit board illustrated in FIG. 28.
Figure 31:
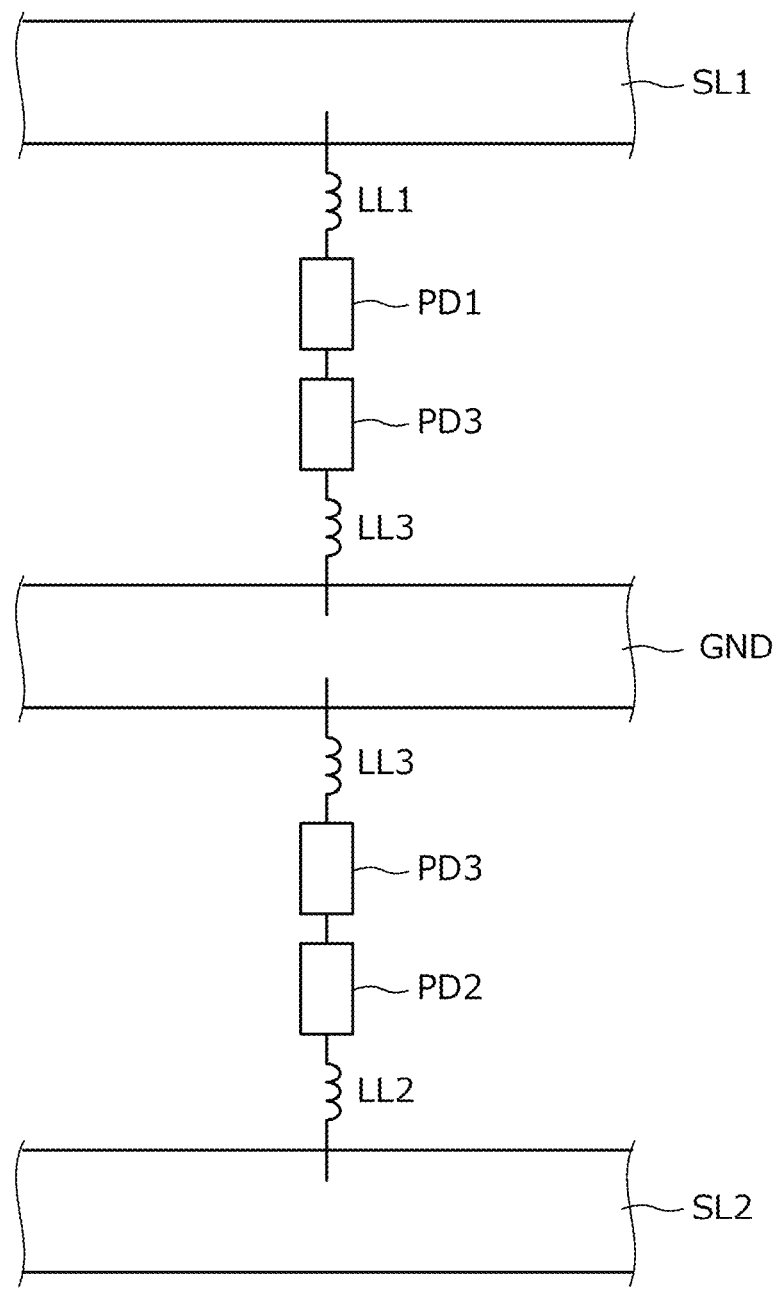
FIG. 31 is an equivalent circuit diagram for the structure illustrated in FIG. 30.

FIG. 30 is a plan view illustrating the structure of coupling of the ESD protection device 11 to signal lines or the like on a circuit board different from the circuit board illustrated in FIG. 28. FIG. 31 is an equivalent circuit diagram for the structure illustrated in FIG. 30.

In FIG. 30, the first signal lines SL1, SL2 are each continuously formed on the circuit board, and the terminals T11, T12 of the ESD protection device 11 are connected to the first signal line SL1. Similarly, the terminals T21, T22 of the ESD protection device 11 are connected to the second signal line SL2. The terminals T31, T32 of the ESD protection device 11 are connected to the Ground pattern GND.

As shown in FIG. 31, a parasitic inductance denoted by an inductor LL1 occurs between the first signal line SL1 and the first ESD protection device PD1, and a parasitic inductance denoted by an inductor LL2 occurs between the second signal line SL2 and the second ESD protection device PD2. In addition, a parasitic inductance denoted by an inductor LL3 occurs between the Ground pattern GND and the third ESD protection device PD3. In each of the first ESD protection device PD1, the second ESD protection device PD2, and the third ESD protection device PD3, a parasitic capacitance occurs at OFF time.

In this manner, a series resonance circuit is formed by the parasitic capacitances of the first ESD protection device PD1 and the third ESD protection device PD3, and the parasitic inductance denoted by the inductors LL1, LL3, and a series resonance circuit is formed by the parasitic capacitances of the second ESD protection device PD2 and the third ESD protection device PD3, and the parasitic inductance denoted by the inductors LL2, LL3.

The inductor LL1 in FIG. 31 is a composite inductor in parallel connection of a series connection inductor including the wire WE11 and the current path L11, and a series connection inductor including the wire WE12 and the current path L12 in FIG. 30. The inductor LL3 is the inductor including the wires WE31, WE32 in FIG. 30, and current paths connected to these wires. The same description for the inductors of the first signal line is applied to the inductors of the second signal lines SL21, SL22.

As is apparent from comparison between the circuit illustrated in FIG. 29 and the circuit illustrated in FIG. 31, the resonant frequency of a series resonance circuit of the parasitic capacitance of the ESD protection device and the parasitic inductor LL3 illustrated in FIG. 29 is higher than the resonant frequency of a series resonance circuit of the parasitic capacitance of the ESD protection device and the parasitic inductors LL1 (or LL2), LL3 illustrated in FIG. 31. In other words, the structure illustrated in FIG. 28 has a higher resonant frequency of the resonant circuit formed between the signal line and the ground, as compared with the structure illustrated in FIG. 30.

FIGS. 32(A) and 32(B) are plan views illustrating the structure of coupling of the diode chip ZDC to the signal lines or the like on the circuit board. Although FIGS. 28 and 30 illustrate an example in which a packaged ESD protection device is mounted on the circuit board, FIGS. 32(A) and 32(B) illustrate an example in which the diode chip ZDC is directly mounted on the circuit board.

In the example of FIG. 32(A), the first signal lines SL11, SL12 are isolated on the circuit board, and are coupled via the terminals E11, E12 of the diode chip ZDC. Similarly, the second signal lines SL21, SL22 are separated on the circuit board, and are coupled via the terminals E21, E22 of the diode chip ZDC. The terminals E31, E32 of the diode chip ZDC are connected to the Ground pattern GND.

In the example of FIG. 32(B), the first signal lines SL1, SL2 are each continuously formed on the circuit board, and the terminals E11, E12 of the diode chip ZDC are connected to the first signal line SL1. Similarly, the terminals E21, E22 of the diode chip ZDC are connected to the second signal line SL2. The terminals E31, E32 of the diode chip ZDC are connected to the Ground pattern GND.

The equivalent circuit in the configuration illustrated in FIG. 32(A) is the same as the circuit illustrated in FIG. 29, and the equivalent circuit in the configuration illustrated in FIG. 32(B) is the same as the circuit illustrated in FIG. 31.

Therefore, the structure illustrated in FIG. 32(A) has a higher resonant frequency of the resonant circuit formed between the signal line and the ground, as compared with the structure illustrated in FIG. 32(B).

In this embodiment, as illustrated in FIGS. 28 and 30, a high or low resonant frequency of the resonant circuit formed between the signal line and the ground can be selected by determining a pattern for signal lines formed in the circuit board while using the same ESD protection device 11. Similarly, as illustrated in FIGS. 32(A) and 32(B), a high or low resonant frequency of the resonant circuit formed between the signal line and the ground can be selected by determining a pattern for signal lines formed in the circuit board while using the same diode chip ZDC.

Also, in this embodiment, even when a low resonant frequency is usable, a signal line in a straightforward, that is, simple conductive pattern can be formed on the circuit board.

10th Embodiment

In a 10th embodiment, a diode chip having a structure is different from that of the diode chips presented so far will be presented.

Figure 33A:
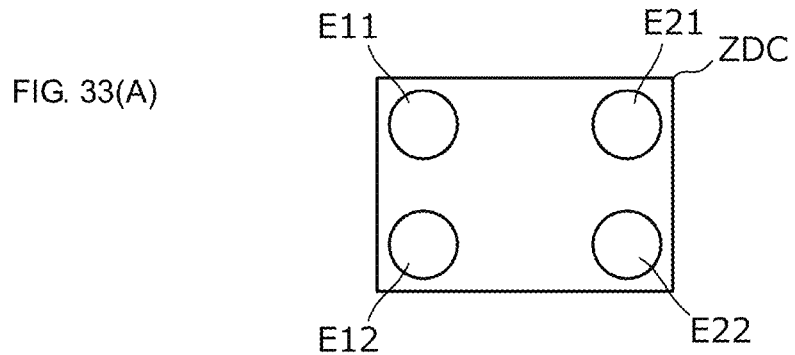
FIG. 33(A) is a plan view illustrating an electrode arrangement of a diode chip ZDC according to a 10th embodiment.
Figure 33B:
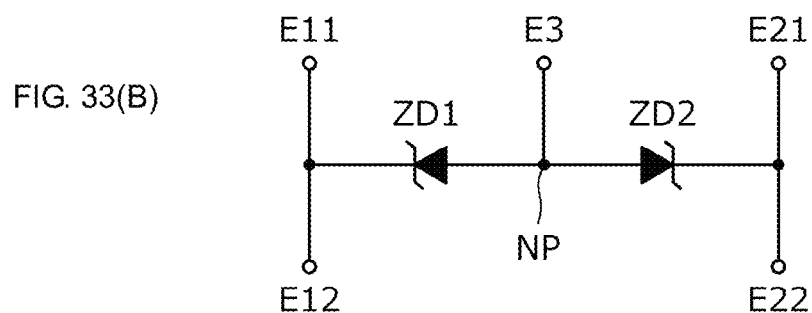
FIG. 33(B) is a circuit diagram.
Figure 33C:
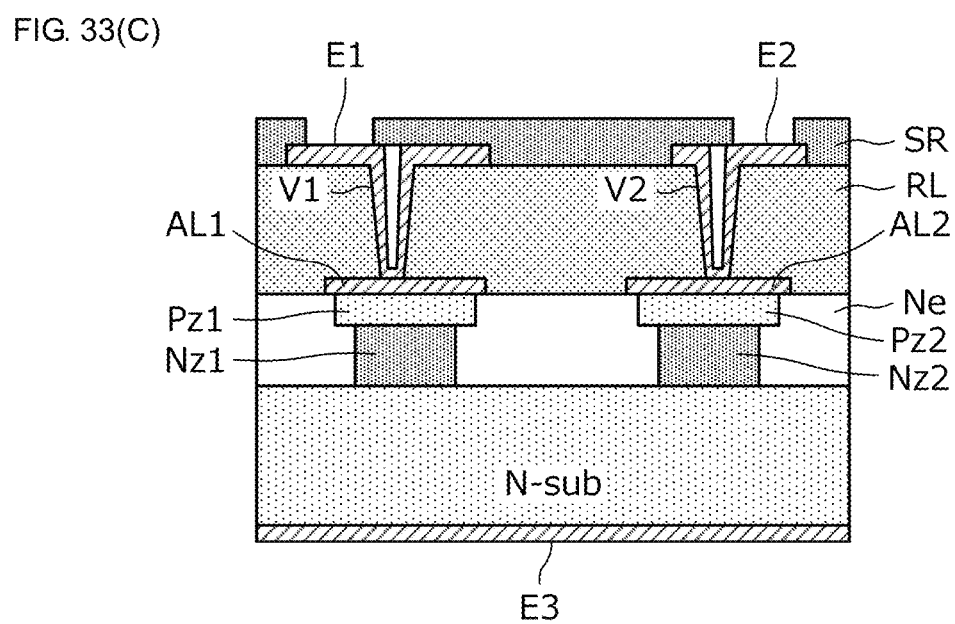
FIG. 33(C) is a vertical sectional view of the diode chip ZDC.

FIG. 33(A) is a plan view illustrating an electrode arrangement of a diode chip ZDC according to this embodiment, FIG. 33(B) is a circuit diagram, and FIG. 33(C) is a vertical sectional view of the diode chip ZDC.

An ESD protection circuit included in the diode chip ZDC in this embodiment includes two Zener diodes. The terminals E11 and E12 are electrically continuous inside, and the first Zener diode ZD1 is connected between the terminals E11, E12 and the nodes NP. Similarly, the terminals E21 and E22 are electrically continuous inside, and the second Zener diode ZD2 is connected between the terminals E21, E22 and the nodes NP.

As shown in FIG. 33(C), the diode chip ZDC includes an N-type substrate (N-type substrate layer) N-sub, an N-type epitaxial layer Ne formed on the N-type substrate, and N-type diffusion layers Nz1, Nz2 and P-type diffusion layers Pz1, Pz2 which are formed in the epitaxial layer Ne. The first Zener diode ZD1 is formed by a junction layer of the N-type diffusion layer Nz1 and the P-type diffusion layer Pz1, and the second Zener diode ZD2 is formed by a junction layer of the N-type diffusion layer Nz2 and the P-type diffusion layer Pz2.

Aluminum wires AL1, AL2 are formed above the P-type diffusion layers Pz1, Pz2, and a re-wiring layer RL is formed above the aluminum wires AL1, AL2. Terminals E1, E2, and an insulation film SR are formed on the upper surface of the re-wiring layer RL. The terminals E1, E2 are coupled to the aluminum wires AL1, AL2, respectively, with vias V1, V2 interposed therebetween.

Also, a terminal E3 is formed using back metal on the back surface of the N-type substrate N-sub. The back metal is such that Ni plating film is formed on the ground, and Au plating film is formed on the surface, for instance.

In this manner, the node between the first Zener diode ZD1 and the second Zener diode ZD2 may be coupled to an external circuit (ground pattern) using the back metal.

Figure 34A:
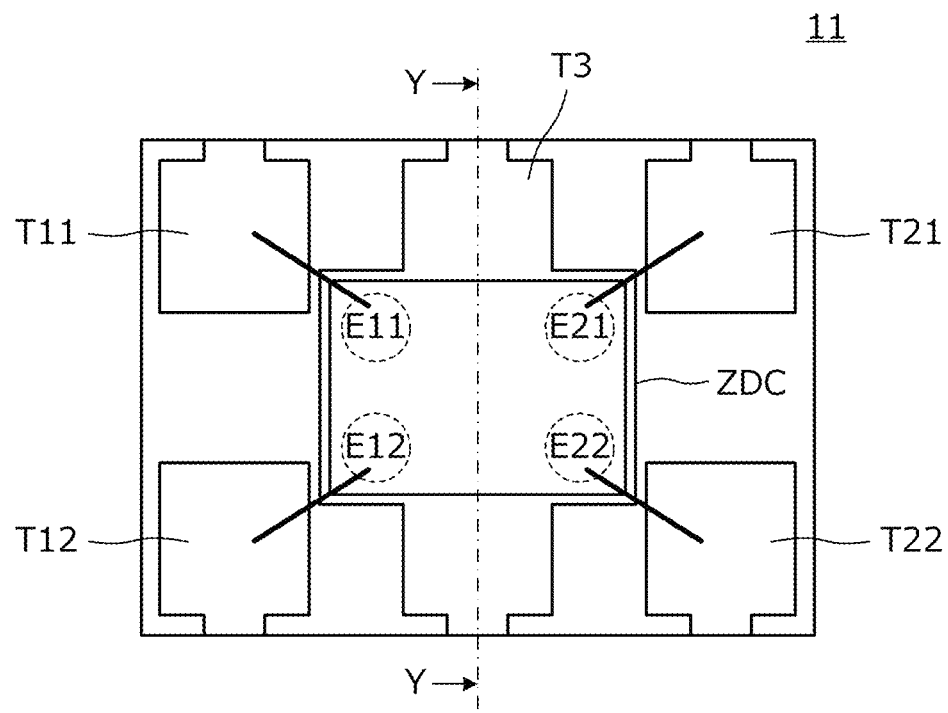
FIG. 34(A) is a plan view illustrating the internal structure of an ESD protection device according to the 10th embodiment.
Figure 34B:
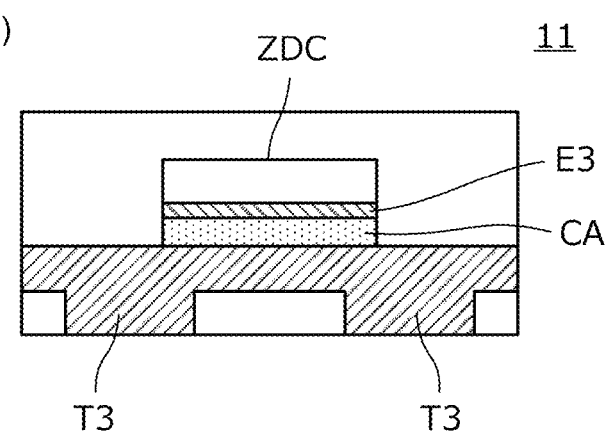
FIG. 34(B) is a vertical sectional view of the ESD protection device.

FIG. 34(A) is a plan view illustrating the internal structure of an ESD protection device including the Zener diode ZDC. FIG. 34(B) is a vertical sectional view of the ESD protection device.

The configuration of the diode chip ZDC provided in the ESD protection device 11 in this embodiment is as illustrated in FIGS. 33(A), 33(B), and 33(C). The ESD protection device 11 is a device in which the diode chip ZDC is die-bonded to a lead frame using a conductive adhesive material CA, and each electrode of the diode chip ZDC is wire-bonded to the lead frame. In the example illustrated in FIG. 34(A), terminals E11, E12, E21, and E22 of the diode chip ZDC are coupled to respective terminals T11, T12, T21, and T22 of the lead frame via a wire.

Figure 35A:
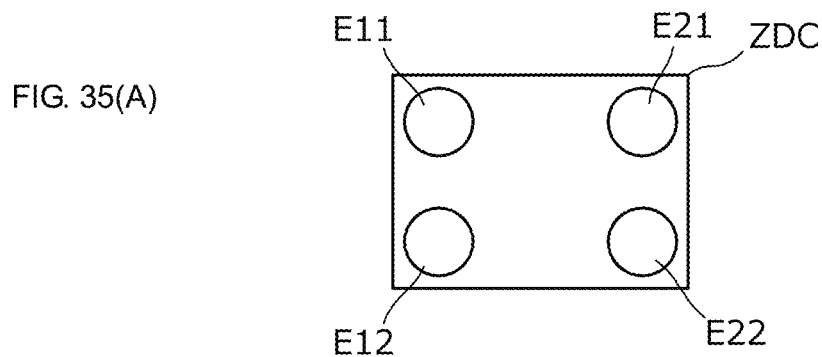
FIG. 35(A) is a plan view illustrating an electrode arrangement of another diode chip ZDC according to the 10th embodiment.
Figure 35B:
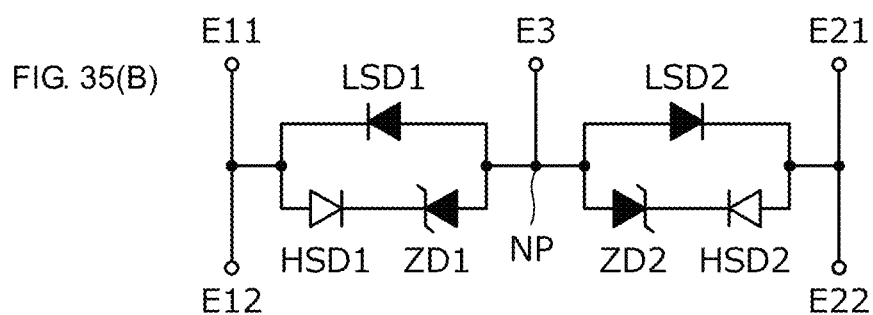
FIG. 35(B) is a circuit diagram.
Figure 35C:
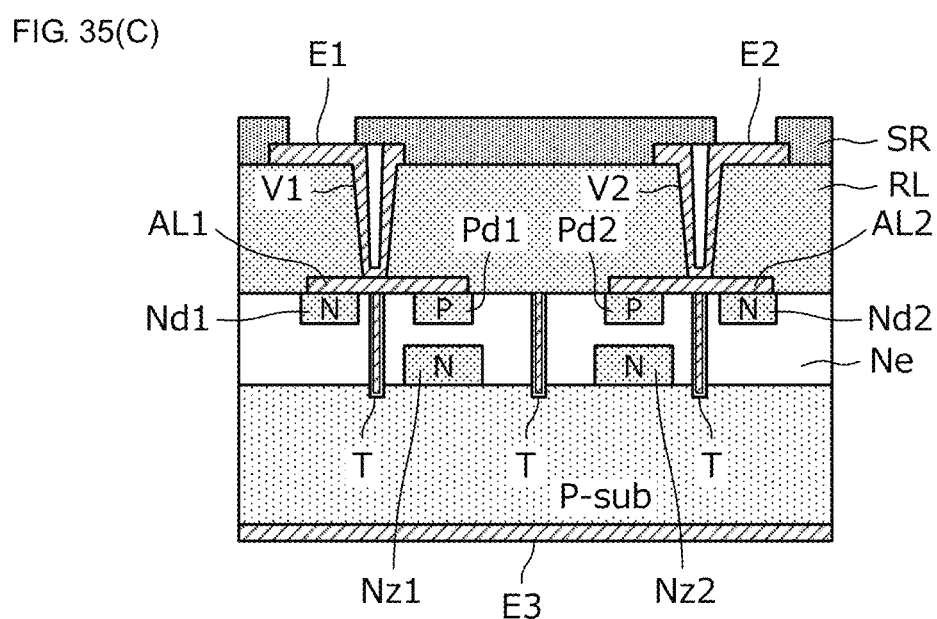
FIG. 35(C) is a vertical sectional view of the diode chip ZDC.

FIG. 35(A) is a plan view illustrating an electrode arrangement of another diode chip ZDC according to this embodiment, FIG. 35(B) is a circuit diagram, and FIG. 35(C) is a vertical sectional view of the diode chip ZDC.

An ESD protection circuit included in the diode chip ZDC in this embodiment includes high current diodes HSD1, HDS2, low current diodes LSD1, LDS2, and Zener diodes ZD1, ZD2. The terminals E11 and E12 are electrically continuous inside, and a first ESD protection device including the high current diode HSD1, the low current diode LSD1, and the Zener diode ZD1 is connected between the terminals E11, E12 and the nodes NP. Similarly, the terminals E21 and E22 are electrically continuous inside, and a second ESD protection device including the high current diode HSD2, the low current diode LSD2, and the Zener diode ZD2 is connected between the terminals E21, E22 and the nodes NP.

As shown in FIG. 35(C), the diode chip ZDC includes a P-type substrate (P-type substrate layer) P-sub, an N-type epitaxial layer Ne formed on the P-type substrate, N-type diffusion layers Nz1, Nz2 formed in the epitaxial layer Ne, and trenches T for device isolation which reach the P-type substrate P-sub from the surface. The epitaxial layer Ne is isolated by the trenches T. The first Zener diode ZD1 is formed by a junction layer of the N-type diffusion layer Nz1 and the P-type substrate P-sub, and the second Zener diode ZD2 is formed by a junction layer of the N-type diffusion layer Nz2 and the P-type substrate P-sub. Also, the low current diodes LSD1, LSD2 are formed by a junction layer of the P-type substrate P-sub and the epitaxial layer Ne. Furthermore, the high current diodes HSD1, HSD2 are formed by a junction layer of the epitaxial layer Ne and P-type diffusion layers Pd1, Pd2.

The N-type diffusion-layer Nd1 and the P-type diffusion-layer Pd1 are coupled via aluminum wire AL1, and the N-type diffusion layer Nd2 and the P-type diffusion layer Pd2 are coupled via aluminum wire AL2.

A re-wiring layer RL is formed above the aluminum wires AL1, AL2. The terminals E1, E2 and an insulation film SR are formed on the upper surface of the re-wiring layer RL. The terminals E1, E2 are coupled to the aluminum wires AL1, AL2, respectively, with vias V1, V2 interposed therebetween.

Also, a terminal E3 is formed using back metal on the back surface of the P-type substrate P-sub.

In this manner, the node between the first ESD protection device and the second ESD protection device may be coupled to an external circuit (ground pattern) using the back metal.

Other Embodiments

In the exemplary embodiments disclosed above, an example has been presented in which a Zener diode is formed as the ESD protection device or as a principal component of the ESD protection device. However, a non-linear resistance element, such as a varistor, in which with application of a high voltage, a resistance value reduces, may be used. Alternatively, a discharge device, in which with application of a high voltage, discharge occurs between spark gaps and a resistance value reduces, may be used.

Moreover, according to the exemplary embodiments disclosed above, an example has been presented in which the third inductor L3 is formed by a conductive pattern. However, an inductor as a chip component may be provided in a multilayer body or on a multilayer body which includes a common mode choke coil. Also, the inductor as the chip component may be mounted on the circuit board.

Furthermore, in the exemplary embodiments presented above, an LC circuit is formed by the first inductor L1 and the parasitic capacitance C1, and an LC circuit is formed by the second inductor L2 and the parasitic capacitance C2. However, a capacitor as a chip component may be connected to each of the first inductor L1 and the second inductor L2.

Lastly, the description of the exemplary embodiments is for illustration in all regards, and not restrictive. It should be appreciated that the embodiments may be modified or changed as needed by those skilled in the art. The scope of the present invention is defined not by the embodiments described above, but by the appended claims. Furthermore, the scope of the present invention includes changes from the embodiments in a range equivalent to the claims.

REFERENCE SIGNS LIST

AL1, AL2, AL3 aluminum wire
C1, C2 parasitic capacitance
CA conductive adhesive material
CMCC common mode choke coil
Czd1, Czd2, Czd3 parasitic capacitance
D1 first diode
D2 second diode
D3 third diode
D4 fourth diode
D5 fifth diode
D6 sixth diode
DTL differential transmission line
E1, E2, E3 terminal
E11, E12, E21, E22 terminal
GND ground pattern
L1 first inductor
L1a, L1b, L1c, L1d, L1e conductive pattern
L2 second inductor
L2a, L2b, L2c, L2d, L2e conductive pattern
L3 third inductor
LM11, LM12, LM21, LM22 matching inductor
MR mold resin
N1, N2, N3 N-type diffusion layer
Nd1, Nd2, Nd3 N-type diffusion layer
Ne, Ne1, Ne2, Ne3 epitaxial layer
Ne11, Ne12 epitaxial layer
Ne21, Ne22 epitaxial layer
Ne31, Ne32 epitaxial layer
NP node
N-sub N-type substrate
Nz1, Nz2, Nz3 N-type diffusion layer
P1 to P6 terminal
PC ESD protection circuit
Pd1, Pd2, Pd3 P-type diffusion layer
PD1 first ESD protection device
PD2 second ESD protection device
PD3 third ESD protection device
Pe epitaxial layer
P-sub P-type substrate
Pz1, Pz2 P-type diffusion layer
RL re-wiring layer
SL1, SL11, SL12 first signal line
SL2, SL21, SL22 second signal line
SR insulation film
SR1 first series resonance circuit
SR2 second series resonance circuit
T trench for device isolation
T11, T12, T21, T22, T31, T32, T3 terminal
V1, V2, V3 via
W11, W13, W14, W21, W22, W23, W24 conductive pattern
WE11, WE12, WE21, WE22, WE31, WE32 wire
ZD1 first Zener diode (first ESD protection device)
ZD2 second Zener diode (second ESD protection device)
ZD3 third Zener diode (third ESD protection device)
ZDC diode chip
11 ESD protection device
101, 102 filter
201 circuit board

The invention claimed is:
1. A filter comprising:
a differential transmission line that includes first and second signal lines;
a common mode choke coil including a first inductor in the first signal line and a second inductor in the second signal line and magnetically coupled to the first inductor; and
an ESD protection circuit including:
a series circuit having first and second ESD protection devices connected between the first and second signal lines, a third ESD protection device connected between a ground and a node between the first and second ESD protection devices, and a third inductor connected in series to the third ESD protection device,
a semiconductor substrate having a substrate layer comprising the node and an epitaxial layer disposed on the substrate layer and on which a first terminal, a second terminal, and a third terminal are disposed,
wherein the third inductor and parasitic capacitances of the first and third ESD protection devices form a first series resonant circuit, and the third inductor and parasitic capacitances of the second and third ESD protection devices form a second series resonant circuit,
wherein the parasitic capacitance of the third ESD protection device is greater than the parasitic capacitance of the first ESD protection device and the parasitic capacitance of the second ESD protection device,
wherein the first ESD protection device comprises a first parallel circuit disposed in the epitaxial layer between the substrate layer and the first terminal and includes a first high current diode and a first low current diode,
wherein the second ESD protection device comprises a second parallel circuit disposed in the epitaxial layer between the substrate layer and the second terminal and includes a second high current diode and a second low current diode, and
wherein the third ESD protection device comprises a third parallel circuit disposed in the epitaxial layer between the substrate layer and the third terminal and includes a third high current diode and a third low current diode,
wherein the third ESD protection device is disposed between the first and second ESD protection devices,
wherein each of the first high current diode and the first low current diode, the second high current diode and the second low current diode, and the third high current diode and the third low current diode extend in an orientation direction that is orthogonal to an orientation direction of the first, second and third ESD protection devices, and wherein in a plan view of the semiconductor substrate, the third low current diode is disposed between the first and second high current diodes, and the third high current diode is disposed between the first and second low current diodes.

2. The filter according to claim 1, wherein the differential transmission line is configured to transmit a high frequency signal.

3. The filter according to claim 1, wherein the third inductor is implemented by one of an inductor device or a parasitic inductance component.

4. The filter according to claim 1, wherein the parasitic capacitance of the first ESD protection device is substantially equal to the parasitic capacitance of the second ESD protection device.

5. The filter according to claim 1, wherein the third inductor comprises one of a coil-shaped or line-shaped conductive pattern with less than one turn.

6. The filter according to claim 1, wherein the differential transmission line, the common mode choke coil, and the ESD protection circuit are disposed in or on a single substrate.

7. The filter according to claim 6, further comprising:
an input/output terminal disposed in or on the substrate and connected to the differential transmission line,
wherein the ESD protection circuit and the common mode choke coil overlap in a plan view of the substrate, and the ESD protection circuit is disposed at a position closer to the input/output terminal of the substrate than a position of the common mode choke coil.

8. The filter according to claim 6, wherein the third inductor does not overlap with the first inductor and the second inductor in a plan view of the substrate.

9. The filter according to claim 1,
wherein the first ESD protection device includes a first Zener diode, a first diode connected in series to the first Zener diode in a direction in which a forward bias current of the first Zener diode is blocked, and a second diode having reverse polarity to the first diode and connected in parallel with a series circuit comprising the first Zener diode and the first diode, and
wherein the second ESD protection device includes a second Zener diode, a third diode connected in series to the second Zener diode in a direction in which a forward bias current of the second Zener diode is blocked, and a fourth diode having reverse polarity to the third diode and connected in parallel with a series circuit comprising the second Zener diode and the third diode.

10. The filter according to claim 9, wherein the third ESD protection device includes a third Zener diode, a fifth diode connected in series to the third Zener diode in a direction in which a forward bias current of the third Zener diode is blocked, and a sixth diode having reverse polarity to the fifth diode and connected in parallel with a series circuit comprising the third Zener diode and the fifth diode.

11. The filter according to claim 1, further comprising at least one matching inductor in the differential transmission line in at least one of a preceding stage and a subsequent stage of the ESD protection circuit.

12. The filter according to claim 1, wherein the third high current diode has a formation area larger than a formation area of the first high current diode and a formation area of the second high current diode, and the third low current diode has a formation area larger than a formation area of the first low current diode and a formation area of the second low current diode.

13. The filter according to claim 1,
wherein the ESD protection circuit includes a semiconductor substrate having a substrate layer and an epitaxial layer disposed on the substrate layer and in which a first terminal, a second terminal, and a third terminal are disposed,
wherein the node comprises the substrate layer,
wherein the first ESD protection device has a first parallel circuit disposed in the epitaxial layer between the substrate layer and the first terminal, and includes a first high current diode and a first low current diode,
wherein the second ESD protection device has a second parallel circuit disposed in the epitaxial layer between the substrate layer and the second terminal, and includes a second high current diode and a second low current diode, and
wherein the third ESD protection device has a Zener diode disposed in the epitaxial layer between the substrate layer and the third terminal.

14. The filter according to claim 13,
wherein the third ESD protection device is disposed in the epitaxial layer and between the first and second ESD protection devices,
wherein each of the first high current diode and the first low current diode and the second high current diode and the second low current diode extend in an orientation direction that is orthogonal to an orientation direction of the first, second and third ESD protection devices, and
wherein in a plan view of the semiconductor substrate, the Zener diode is disposed between the first and second high current diodes and between the first and second low current diodes.

15. A ESD protection circuit for a filter, the ESD protection circuit comprising:
a semiconductor substrate having a substrate layer and an epitaxial layer disposed on the substrate layer and on which a first terminal, a second terminal, and a third terminal are disposed,
first and second ESD protection devices connected in series between first and second signal lines of a differential transmission line;
a third ESD protection device connected between ground and a node formed in the substrate layer and between the first and second ESD protection devices; and
a third inductor connected in series between the ground and the third ESD protection device,
wherein a first series resonant circuit is formed by the third inductor and parasitic capacitances of the first and third ESD protection devices,
wherein a second series resonant circuit is formed by the third inductor and parasitic capacitances of the second and third ESD protection devices,
wherein the parasitic capacitance of the third ESD protection device is greater than the parasitic capacitance of the first ESD protection device and the parasitic capacitance of the second ESD protection device,
wherein the first ESD protection device comprises a first parallel circuit disposed in the epitaxial layer between the substrate layer and the first terminal and includes a first high current diode and a first low current diode,
wherein the second ESD protection device comprises a second parallel circuit disposed in the epitaxial layer between the substrate layer and the second terminal and includes a second high current diode and a second low current diode, and wherein the third ESD protection device comprises a third parallel circuit disposed in the epitaxial layer between the substrate layer and the third terminal and includes a third high current diode and a third low current diode, wherein the third ESD protection device is disposed between the first and second ESD protection devices, wherein each of the first high current diode and the first low current diode, the second high current diode and the second low current diode, and the third high current diode and the third low current diode extend in an orientation direction that is orthogonal to an orientation direction of the first, second and third ESD protection devices, and wherein in a plan view of the semiconductor substrate, the third low current diode is disposed between the first and second high current diodes, and the third high current diode is disposed between the first and second low current diodes.

16. The ESD protection circuit to claim 15, wherein the first and second signal lines form a differential transmission line configured to transmit a high frequency signal, wherein the filter includes a common mode choke coil including a first inductor in the first signal line and a second inductor in the second signal line and magnetically coupled to the first inductor.

17. The ESD protection circuit to claim 15, wherein the third inductor is implemented by one of an inductor device or a parasitic inductance component, and wherein the parasitic capacitance of the first ESD protection device is substantially equal to the parasitic capacitance of the second ESD protection device.

* * * * *